US012810811B2

(12) United States Patent
Zhang

(10) Patent No.: US 12,810,811 B2
(45) Date of Patent: Nov. 24, 2026

(54) SCANNING CIRCUIT, DISPLAY PANEL AND DISPLAY DEVICE

(71) Applicant: Wuhan Tianma Microelectronics Co., Ltd., Wuhan (CN)

(72) Inventor: Wenshuai Zhang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 19/254,022

(22) Filed: Jun. 30, 2025

(65) Prior Publication Data

US 2025/0329299 A1 Oct. 23, 2025

(30) Foreign Application Priority Data

Mar. 25, 2025 (CN) ......................... 202510360766.9

(51) Int. Cl.
*G09G 3/3266* (2016.01)
*G09G 3/3225* (2016.01)
*G11C 19/28* (2006.01)

(52) U.S. Cl.
CPC ......... *G09G 3/3266* (2013.01); *G09G 3/3225* (2013.01); *G11C 19/287* (2013.01); *G09G 2300/0842* (2013.01); *G09G 2300/0861* (2013.01); *G09G 2310/0286* (2013.01)

(58) Field of Classification Search
CPC ............................................. G09G 2310/0286
See application file for complete search history.

(56) References Cited

U.S. PATENT DOCUMENTS

2006/0028461 A1* 2/2006 Lu .......................... G11C 19/28 345/204
2006/0187177 A1* 8/2006 Kuo ....................... G11C 19/28 345/100
2014/0219412 A1* 8/2014 Chien .................... G11C 19/28 377/68
2023/0395008 A1* 12/2023 Yan ...................... G09G 3/3266

FOREIGN PATENT DOCUMENTS

CN 103366822 A 10/2013
CN 119580644 A 3/2025
CN 119993031 A 5/2025

OTHER PUBLICATIONS

International Search Report (PCT/CN2026/080792); Date of Mailing: May 22, 2026(6 pages).

* cited by examiner

*Primary Examiner* — Nan-Ying Yang
(74) *Attorney, Agent, or Firm* — Wiersch Law Group

(57) ABSTRACT

Provided are a scanning circuit, a display panel and a display device. The scanning circuit at least includes a cascaded first shift register units, the first shift register unit includes a first input module and a first cascade module, an input terminal of the first input module is used for receiving a first trigger signal, and an output terminal of the first cascade module is used for outputting a first cascade signal. The first shift register unit further includes a first voltage-stabilizing switch module having an output terminal of the first voltage-stabilizing switch module electrically connected to the output terminal of a first input unit; and/or part of the control terminals of the first cascade module. The stability of the potential of the output terminal of the first input module and/or part of the control terminals of the first cascade module can be improved.

19 Claims, 29 Drawing Sheets

SCANNING CIRCUIT, DISPLAY PANEL AND DISPLAY DEVICE

CROSS-REFERENCE TO RELATED APPLICATIONS

The present application claims priority to Chinese patent application No. 202510360766.9, filed on Mar. 25, 2025, which is hereby incorporated by reference in its entirety.

TECHNICAL FIELD

The present disclosure relates to the field of display technologies and, in particular, to a scanning circuit, a display panel and a display device.

BACKGROUND

In the art of display technologies, a plurality of groups of scanning circuits are usually provided in a display panel to drive pixel circuits in a display region to work, and the scanning circuits are usually composed of a plurality of cascaded shift register units.

However, in the prior art, there is a problem of abnormal node potential in the shift register unit, which is prone to affecting the operational reliability of the shift register unit. In view of this, a solution is urgently needed.

SUMMARY

In view of this, embodiments of the present disclosure provide a scanning circuit, a display panel and a display device to solve the above-mentioned problems.

In a first aspect, an embodiment of the present disclosure provides a scanning circuit, the scanning circuit at least includes a plurality of cascaded first shift register units, the first shift register unit includes a first input module and a first cascade module, an input terminal of the first input module is configured to receive a first trigger signal, and an output terminal of the first cascade module is configured to output a first cascade signal; the first shift register unit further includes a first voltage-stabilizing switch module, and the output terminal of the first voltage-stabilizing switch module is electrically connected to the output terminal of a first input unit; and/or the output terminal of the first voltage-stabilizing switch module is electrically connected to part of the control terminals of the first cascade module.

In a second aspect, an embodiment of the present disclosure provides a display panel, including a scanning circuit. The scanning circuit at least includes a plurality of cascaded first shift register units, the first shift register unit includes a first input module and a first cascade module, an input terminal of the first input module is configured to receive a first trigger signal, and an output terminal of the first cascade module is configured to output a first cascade signal; the first shift register unit further includes a first voltage-stabilizing switch module, and the output terminal of the first voltage-stabilizing switch module is electrically connected to the output terminal of a first input unit; and/or the output terminal of the first voltage-stabilizing switch module is electrically connected to part of the control terminals of the first cascade module.

In a third aspect, an embodiment of the present disclosure provides a display device, including a display panel. The display panel includes a scanning circuit. The scanning circuit at least includes a plurality of cascaded first shift register units, the first shift register unit includes a first input module and a first cascade module, an input terminal of the first input module is configured to receive a first trigger signal, and an output terminal of the first cascade module is configured to output a first cascade signal; the first shift register unit further includes a first voltage-stabilizing switch module, and the output terminal of the first voltage-stabilizing switch module is electrically connected to the output terminal of a first input unit; and/or the output terminal of the first voltage-stabilizing switch module is electrically connected to part of the control terminals of the first cascade module.

BRIEF DESCRIPTION OF DRAWINGS

In order to more clearly describe the technical solutions of embodiments of the present disclosure, the following briefly describes the drawings desired in these embodiments. It is appreciated that, the drawings described below are merely some embodiments of the present disclosure, and for those skilled in the art, other drawings can be obtained based on these drawings without any creative effort.

DESCRIPTION OF EMBODIMENTS

In order to better understand the technical solutions of the present disclosure, embodiments of the present disclosure are described in detail as follows with reference to the drawings.

It should be noted that, the described embodiments are merely some of, rather than all of, the embodiments of the present disclosure. All other embodiments obtained by those skilled in the art without creative efforts according to the embodiments of the present disclosure shall fall within a scope of the present disclosure.

The terms used in the embodiments of the present disclosure are only for the purpose of describing specific embodiments, and are not intended to limit the present disclosure. The singular forms “a/an”, “said”, and “the” used in the embodiments of the present disclosure and the attached claims are also intended to include plural forms thereof, unless noted otherwise in the context.

It should be understood that the term “and/or” used herein is merely an association relationship describing an associated object, and indicates that there may be three relationships. For example, A and/or B may indicate A alone, both A and B, and B alone. In addition, the symbol “/” in the context generally indicates that the objects in front of and behind “/” are in an “or” relationship.

Various modifications and changes can be made to the present disclosure without departing from the scope of the disclosure, which are obvious to those skilled in the art. Accordingly, the present disclosure aims at covering the modifications and variations of the present disclosure that fall within the scope of corresponding claims (claimed technical solutions) and the equivalents thereof. It should be noted that the embodiments shown in the present disclosure can be combined mutually in the case of no conflict.

Figure 1:
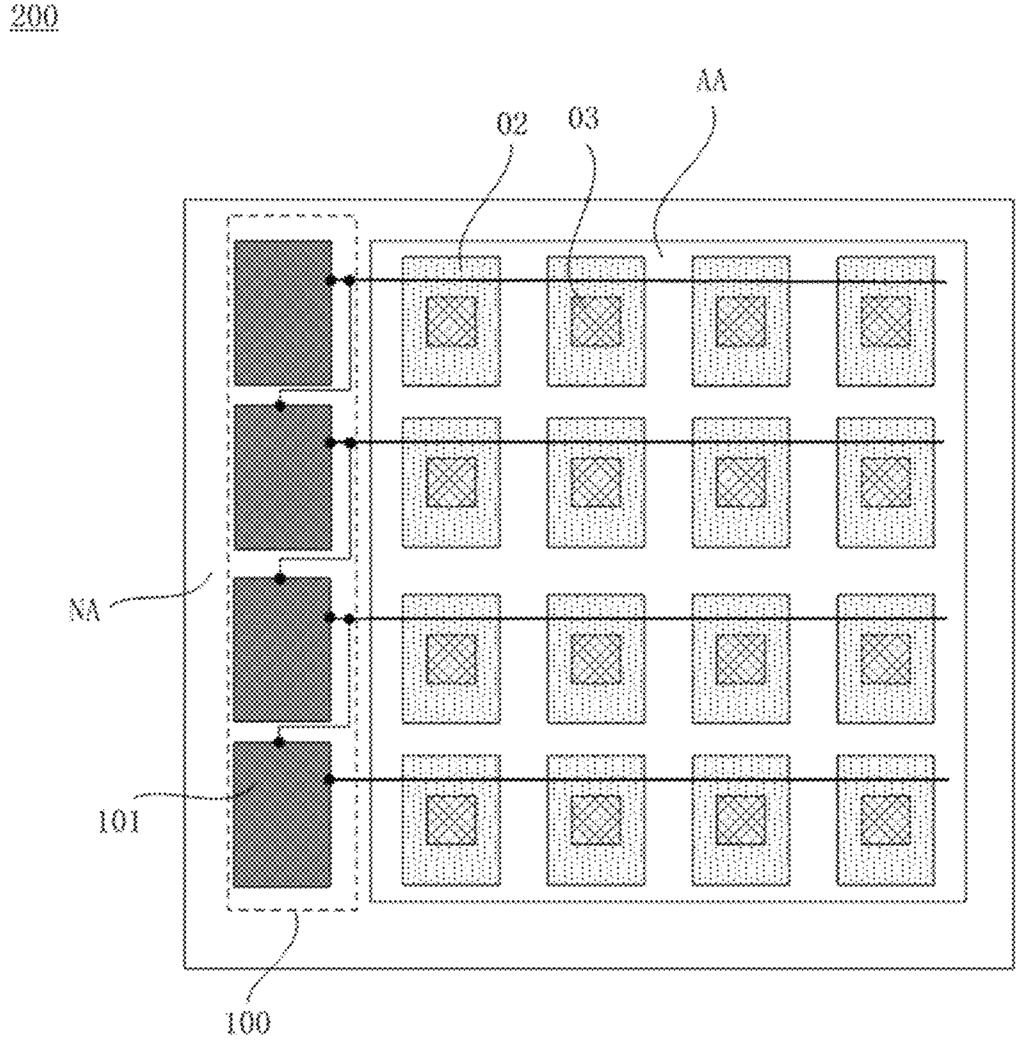
FIG. 1 is a schematic plane diagram of a display panel according to an embodiment of the present disclosure.

FIG. 1 is a schematic plane diagram of a display panel according to an embodiment of the present disclosure.

An embodiment of the present disclosure provides a scanning circuit 100 for driving a pixel circuit 02. As shown in FIG. 1, as a possible application scenario, both the scanning circuit 100 and the pixel circuit 02 are arranged in a display panel 200. The display panel 200 includes a display region AA and a bezel region NA located around the display region AA The bezel region NA may surround the display region AA.

The scanning circuit 100 is located in the bezel region NA, and the pixel circuit 02 is located in the display region AA, and the pixel circuit 02 is electrically connected to the light-emitting device 03 and is configured to drive the light-emitting device 03 to emit light. The scanning circuit 100 is electrically connected to the pixel circuit 02 and is configured to provide a gate scanning signal to the pixel circuit 02 to drive the pixel circuit 02 to operate.

The scanning circuit 100 includes a plurality of cascaded first shift register units 101, and optionally, the first shift register unit 101 is configured to provide a gate scanning signal to a gate reset transistor and/or a threshold capturing transistor in the pixel circuit 02.

Figure 2:
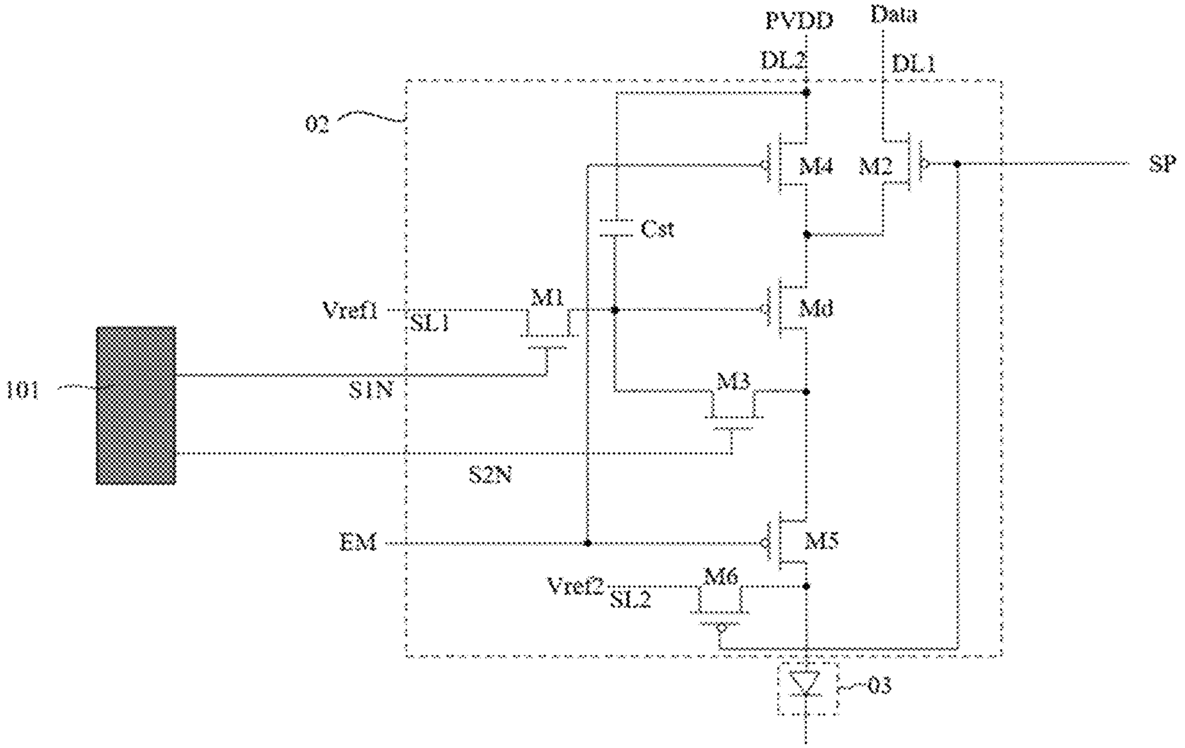
FIG. 2 is a schematic diagram of a pixel circuit according to an embodiment of the present disclosure.

FIG. 2 is a schematic diagram of a pixel circuit according to an embodiment of the present disclosure. For example, as shown in FIG. 2, the pixel circuit 02 includes a driving transistor Md, a gate reset transistor M1, a data writing transistor M2, a threshold capturing transistor M3, a power supply voltage writing transistor M4, a light emitting control transistor M5, a light emitting reset transistor M6 and a storage capacitor Cst.

A first electrode of the gate reset transistor M1 is electrically connected to the first reset signal line SL1, a second electrode of the gate reset transistor M1 is electrically connected to the gate of the driving transistor Md, a gate of the gate reset transistor M1 is electrically connected to the first scan line S1N, and the first reset signal line SL1 transmits the first reset voltage Vref1. The first electrode of the data writing transistor M2 is electrically connected to the data signal line DL1, the second electrode of the data writing transistor M2 is electrically connected to the first electrode of the driving transistor Md, the gate electrode of the data writing transistor M2 is electrically connected to a second scan line SP, and the data signal line DL1 transmits the data voltage Data. The first electrode of the threshold capturing transistor M3 is electrically connected to the second electrode of the driving transistor Md, the second electrode of the threshold capturing transistor M3 is electrically connected to the gate of the driving transistor Md, and the gate of the threshold capturing transistor M3 is electrically connected to a third scan line S2N.

The first electrode of the power supply voltage writing transistor M4 is electrically connected to a first power supply signal line DL2, the second electrode of the power supply voltage writing transistor M4 is electrically connected to the first electrode of the driving transistor Md, the gate of the power supply voltage writing transistor M4 is electrically connected to the light-emitting control signal line EM, and the first power supply signal line DL2 transmits a first power supply voltage PVDD. The first electrode of the light emitting control transistor M5 is electrically connected to the second electrode of the driving transistor Md, the second electrode of the light-emitting control transistor M5 is electrically connected to the first electrode of the light-emitting device 03, and the gate of the light-emitting control transistor M5 is electrically connected to the light-emitting control signal line EM. The first electrode of the light emitting reset transistor M6 is electrically connected to the second reset signal line SL2, the second electrode of the light-emitting reset transistor M6 is electrically connected to the first electrode of the light-emitting device 03, the gate of the light-emitting reset transistor M6 is electrically connected to the second scan line SP, and the second reset signal line SL2 transmits a second reset voltage Vref2. One plate of the storage capacitor Cst is electrically connected to the gate of the driving transistor Md, and another plate is electrically connected to the first power supply signal line DL1.

For example, the gate reset transistor M1 and the threshold capturing transistor M3 each includes a metal oxide, the gate reset transistor M1 and the threshold capturing transistor M3 are N-type transistors, the driving transistor Md, the data writing transistor M2, the power supply voltage writing transistor M4, the light emitting control transistor M5, and the light emitting reset transistor M6 are P-type transistors, the first shift register unit 101 may provide the scanning signal to the gate of the gate reset transistor M1 through the first scan line S1N, and/or provide the scanning signal to the gate of the threshold grabbing transistor M3 through the third scanning line S2N. The enable signal output by the first shift register unit 101 may be the high-level signal.

Figure 3:
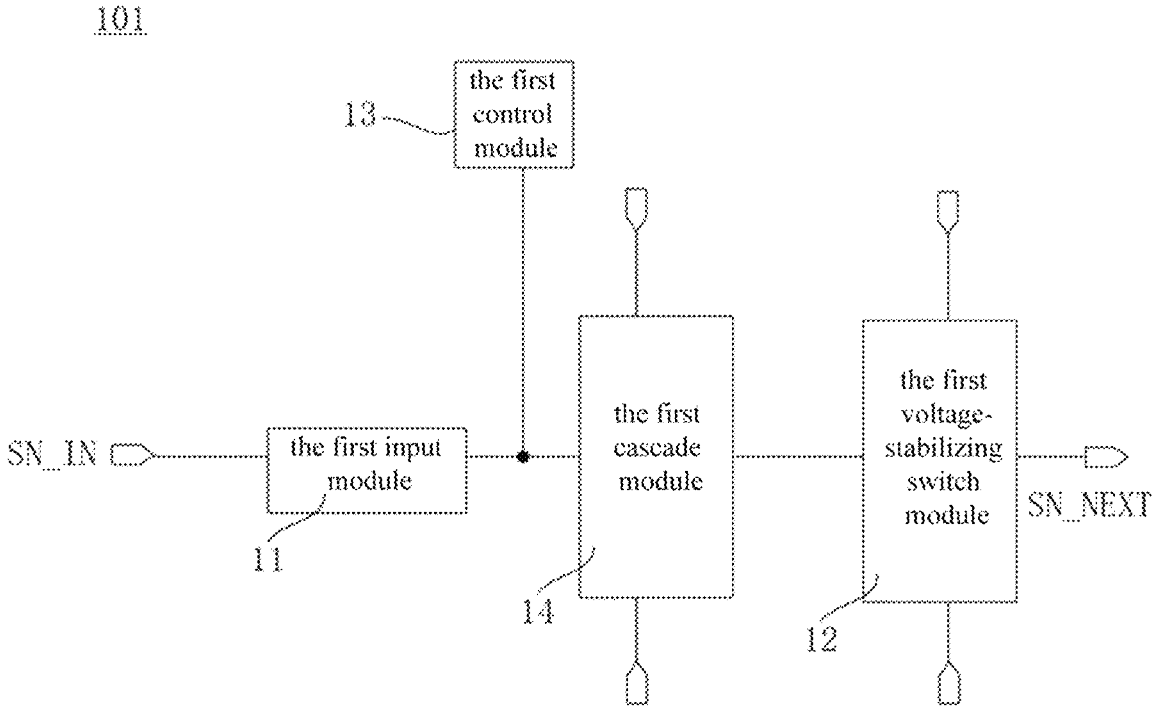
FIG. 3 is a partial schematic diagram of a shift register unit according to an embodiment of the present disclosure.
Figure 4:
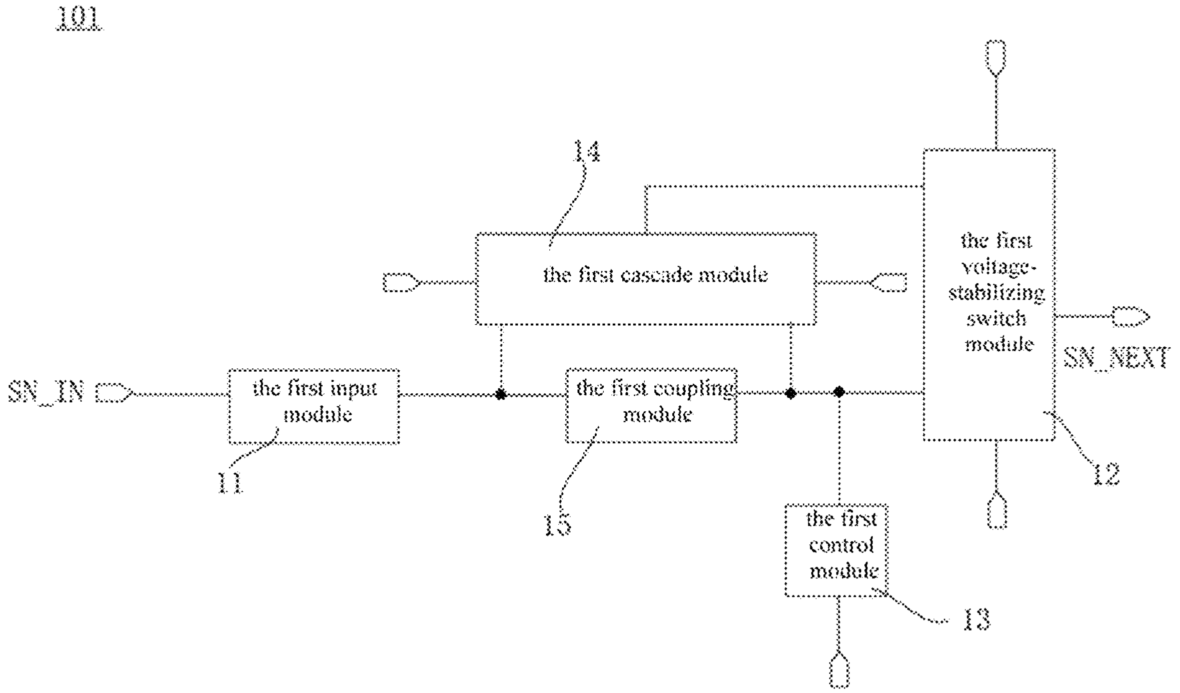
FIG. 4 is a partial schematic diagram of another first shift register unit according to an embodiment of the present disclosure.

FIG. 3 is a partial schematic diagram of a first shift register unit according to an embodiment of the present disclosure. FIG. 4 is a partial schematic diagram of another first shift register unit according to an embodiment of the present disclosure.

As shown in FIG. 3 and FIG. 4, the first shift register unit 101 includes a first input module 11 and a first cascade module 12, an input terminal of the first input module 11 is configured to receive a first trigger signal SN_IN, and an output terminal SN_NEXT of the first cascade module 12 is configured to output a first cascade signal. The first cascade signal output by the first cascade module 12 in the proceeding stage of first shift register unit 101 may be used as the first trigger signal SN_IN received by the first input module 11 in the subsequent stage of first shift register unit 101.

The first shift register unit 101 further includes a first voltage-stabilizing switch module 13, and the output terminal of the first voltage-stabilizing switch module 13 is electrically connected to the output terminal of the first input module 11, and/or the output terminal of the first voltage-stabilizing switch module 13 is electrically connected to part of control terminals of the first cascade module 12.

The first voltage-stabilizing switch module 13 may transmit a voltage-stabilizing signal to the output terminal of the first input module 11 and/or part of control terminals of the first cascade module 12, to stabilize a potential of the output terminal of the first input module 11 and/or part of control terminals of the first cascade module 12.

Exemplarily, as shown in FIG. 3, the first shift register unit 101 further includes a first control module 14, the control terminal of the first control module 14 is electrically connected to the output terminal of the first input module 11, the output terminal of the first control module 14 is electrically connected to the control terminal of the first cascade module 12, and the output terminal of the first voltage-stabilizing switch module 13 is electrically connected to the output terminal of the first input module 11.

Exemplarily, as shown in FIG. 4, the first shift register unit 101 further includes a first control module 14, the first cascade module 12 includes a first control terminal and a second control terminal, the first control terminal of the first cascade module 12 is electrically connected to the output terminal of the first control module 14, the second control terminal of the first cascade module 12 is coupled to the output terminal of the first input module 11, and a first coupling module 15 is arranged between the second control terminal of the first cascade module 12 and the first input module 11.

The first control module 14 includes the first control terminal and the second control terminal, the output terminal of the first input module 11 is further electrically connected to the first control terminal of the first control module 14, the second control terminal of the first cascade module 12 is further electrically connected to the second control terminal of the first control module 14, and the output terminal of the first voltage-stabilizing switch module 13 is electrically connected to the second control terminal of the first cascade module 12.

It should be noted that, in the first shift register unit 101 shown in FIG. 4, the output terminal of the first input module 11 and the second control terminal of the first cascade module 12 may also be directly electrically connected, that is, no first coupling module 15 is arranged between the output terminal of the first input module 11 and the second control terminal of the first cascade module 12. In this case, the output terminal of the first voltage-stabilizing switch module 13 may be arranged to be electrically connected to the second control terminal of the first cascade module 12, and electrically connected to the output terminal of the first input module 11.

The inventor of the present disclosure has found through research that, in the prior art, the first trigger signal typically undergoes threshold degradation after passing through the first input module, which may cause an inaccurate potential of the output terminal of the first input module, thereby resulting in an abnormality of a functional module located after the first input module, and affecting the normal operation of the first shift register unit.

In addition, when the potential of the output terminal of the first input module is used as part of the control signal of the first cascade module, since a first coupling module may be further arranged between the output terminal of the first input module and the control terminal of the first cascade module, if only the potential of the output terminal of the first input module is adjusted, the effect of stabilizing the potential of the control terminal of the first cascade module is limited, and the first cascade module may still be prone operating abnormally.

In view of this, in an embodiment of the present disclosure, the output terminal of the first voltage-stabilizing switch module 13 is electrically connected to the output terminal of the first input module 11, and/or the output terminal of the first voltage-stabilizing switch module 13 is electrically connected to a part of control terminals of the first cascade module 12, so as to improve thee operational reliability of the first shift register unit.

In an embodiment of the present disclosure, if the output terminal of the first voltage-stabilizing switch module 13 is electrically connected to the output terminal of the first input module 11, the first voltage-stabilizing switch module 13 can provide a voltage-stabilizing signal to the output terminal of the first input module 11, and compensate for the potential loss in the output process of the first input module 11, which is beneficial to improving the accuracy and stability of the potential of the output terminal of the first input module 11, further beneficial to improving the operational reliability of other modules receiving the potential of the output terminal of the first input module 11, and furthermore beneficial to improving the operational reliability of the first shift register unit 101.

If the output terminal of the first voltage-stabilizing switch module 13 is electrically connected to part of the control terminals of the first cascade module 12, the first voltage-stabilizing switch module 13 can provide a voltage-stabilizing signal to part of the control terminals of the first cascade module 12, which is beneficial to improving the stability of the potential of the control terminals of the first cascade module 12, further beneficial to improving the operational reliability of the first cascade module 12, and furthermore beneficial to improving the operational reliability of the first shift register unit 101.

Figure 5:
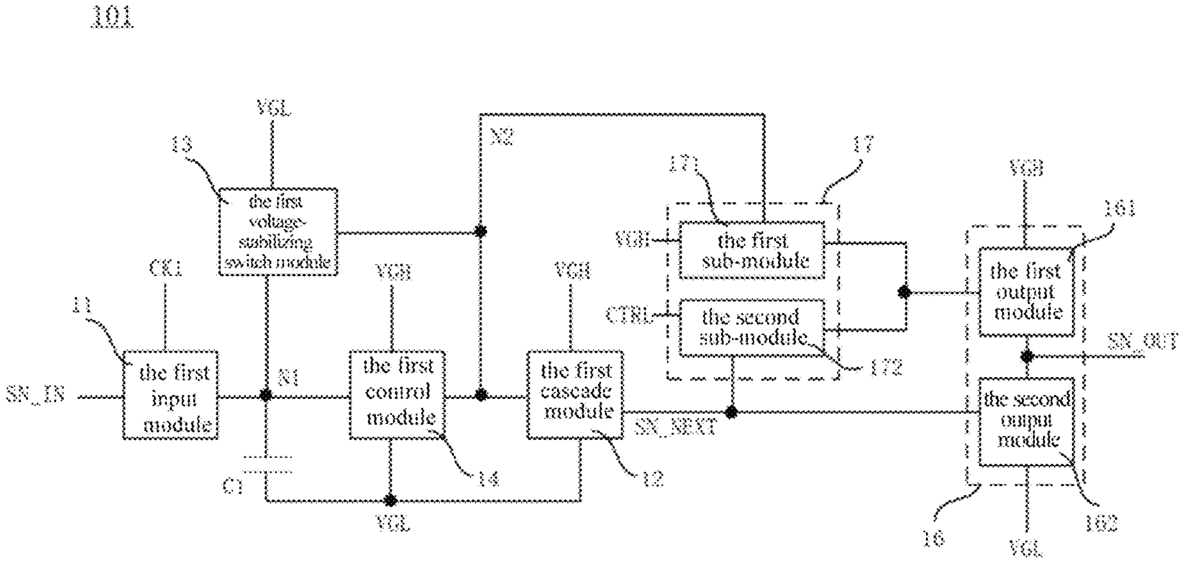
FIG. 5 is a schematic diagram of a first shift register unit according to an embodiment of the present disclosure.
Figure 6:
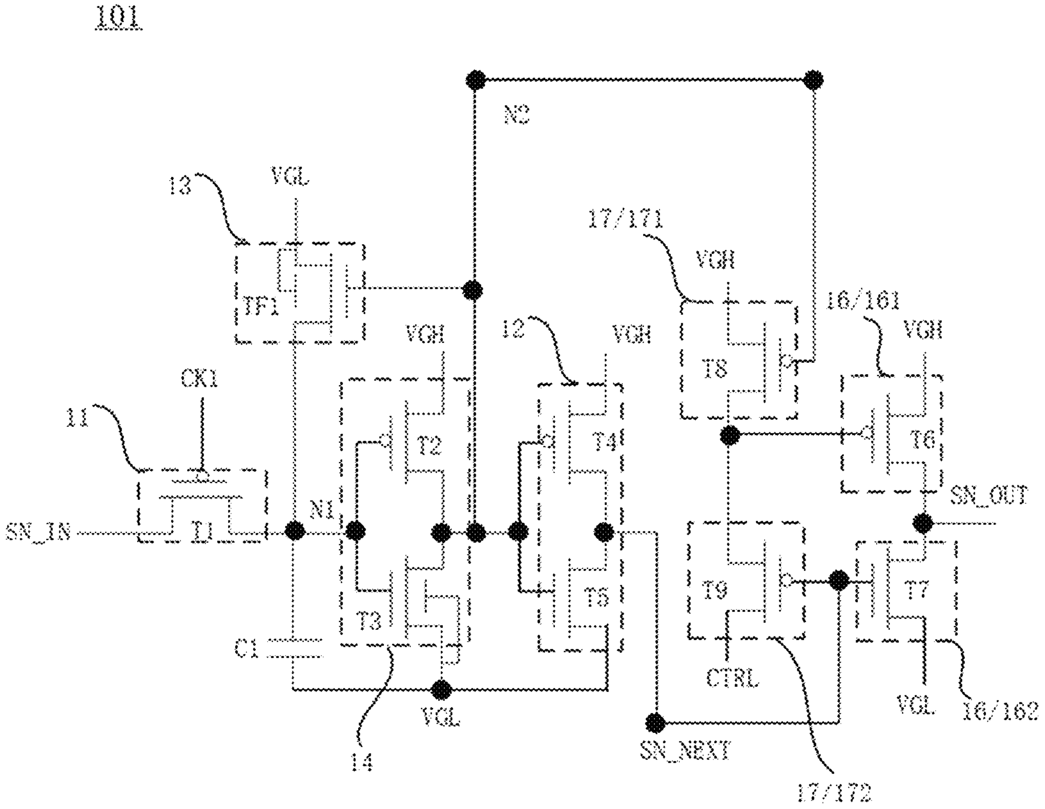
FIG. 6 is a schematic diagram of a first shift register unit shown in FIG. 5.

FIG. 5 is a schematic diagram of a first shift register unit according to an embodiment of the present disclosure. FIG. 6 is a schematic diagram of the first shift register unit shown in FIG. 5.

In an embodiment of the present disclosure, as shown in FIG. 5, the output terminal of the first input module 11 is electrically connected to a first node N1, the control terminal receives a first clock signal CK1, a first input terminal of the first cascade module 12 receives a first fixed potential signal VGH, a second input terminal receives a second fixed potential signal VGL, and the control terminal is electrically connected to a second node N2. The first fixed potential signal VGH is a high-level potential signal, and the second fixed potential signal VGL is a low-level potential signal.

The first shift register unit 101 further includes a first control module 14, the first input terminal of the first control module 14 receives the first fixed potential signal VGH, the second input terminal of the first control module 14 receives the second fixed potential signal VGL, the control terminal of the first control module 14 is electrically connected to the first node N1, and the output terminal of the first control module 14 is electrically connected to the second node N2.

The input terminal of the first voltage-stabilizing switch module 13 receives the second fixed potential signal VGL, the output terminal of the first voltage-stabilizing switch module 13 is electrically connected to the first node N1, and the control terminal of the first voltage-stabilizing switch module 13 is electrically connected to the second node N2.

Exemplarily, as shown in FIG. 6, the first input module 11 includes a first transistor T1, the first electrode of the first transistor T1 receives the first trigger signal SN_IN, the second electrode of the first transistor T1 is electrically connected to the first node N1, and the gate of the first transistor T1 receives the first clock signal CK1.

The first control module 14 includes a second transistor T2 and a third transistor T3 having different channel types, the first electrode of the second transistor T2 receives the first fixed potential signal VGH, the second electrode of the second transistor T2 is electrically connected to the second node N2, the gate of the second transistor T2 is electrically connected to the first node N1, the first electrode of the third transistor T3 receives the second fixed potential signal VGL, the second electrode of the third transistor T3 is electrically connected to the second node N2, and the gate of the third transistor T3 is electrically connected to the first node N1. The first control module 14 transmits the first fixed potential signal VGH or the second fixed potential signal VGL to the second node N2 in response to the potential of the first node N1. The potential level of the first node N1 may be opposite to the potential level of the second node N2.

The first cascade module 12 includes a fourth transistor T4 and a fifth transistor T5 having different channel types, the first electrode of the fourth transistor T4 receives the first fixed potential signal VGH, the second electrode of the fourth transistor T4 is electrically connected to the output terminal SN_NEXT of the first cascade module 12, the gate electrode of the fourth transistor T4 is electrically connected to the second node N2, the first electrode of the fifth transistor T5 receives the second fixed potential signal VGL, the second electrode of the fifth transistor T5 is electrically connected to the output terminal SN_NEXT of the first cascade module 12, and the gate electrode of the fifth transistor T5 is electrically connected to the second node N2. The first cascade module 12 outputs the first fixed potential signal VGH or the second fixed potential signal VGL as the first cascade signal in response to the potential of the second node N2, and the potential level of the output terminal SN_NEXT of the first cascade module 12 may be opposite to the potential level of the second node N2.

The first voltage-stabilizing switch module 13 includes a first voltage-stabilizing transistor TF1, the first electrode of the first voltage-stabilizing transistor TF1 receives the second fixed potential signal VGL, the second electrode of the first voltage-stabilizing transistor TF1 is electrically connected to the first node N1, and the gate of the first voltage-stabilizing transistor TF1 is electrically connected to the second node N2.

The second transistor T2 and the fourth transistor T4 have the same channel type, and the third transistor T3, the first voltage-stabilizing transistor TF1 and the fifth transistor T5 have the same channel type.

Exemplarily, the second transistor T2 and the fourth transistor T4 are both P-type transistors, and the third transistor T3, the first voltage-stabilizing transistor TF1 and the fifth transistor T5 are all N-type transistors.

In an embodiment, the third transistor T3, the first voltage-stabilizing transistor TF1 and the fifth transistor T5 each include a metal oxide, and the third transistor T3, the first voltage-stabilizing transistor TF1 and the fifth transistor T5 may all have a top-bottom double-gate structure.

Exemplarily, as shown in FIG. 6, a bottom gate of the third transistor T3 is electrically connected to its first electrode, and the bottom gate of the first voltage-stabilizing transistor TF1 is electrically connected to its first electrode, so as to improve the stability of the threshold voltage during the long-term operation process of the third transistor T3 and the first voltage-stabilizing transistor TF1, and further improve the operation stability of the third transistor T3 and the first voltage-stabilizing transistor TF1. The bottom gate of the fifth transistor T5 may be electrically connected to the top gate to improve the driving capability of the fifth transistor T5.

In an embodiment of the present disclosure, when the low-level first trigger signal SN_IN is transmitted to the first node N1 through the first transistor T1, the second transistor T2 is turned on, the high-level first fixed potential signal VGH is transmitted to the second node N2 through the second transistor T2, the high-level potential of the second node N2 controls the first voltage-stabilizing transistor TF1 to be turned on, and the low-level second fixed potential VGL is transmitted to the first node N1 through the first voltage-stabilizing transistor TF1. Thus, the loss of the low-level first trigger signal SN_IN passing through the first transistor T1 may be compensated, which is beneficial to stabilizing the low-level potential of the first node N1, thereby improving the reliability of the second transistor T2 being turned on and the third transistor T3 being turned off, and further contributing to improving the operational reliability of the first shift register unit 101.

In an embodiment of the present disclosure, as shown in FIG. 5, the first shift register unit 101 further includes a first-type signal output module 16, the output terminal SN_OUT of the first-type signal output module 16 is configured to output a first-type scanning signal, the first-type scanning signal may be a gate scanning signal transmitted to the gate reset transistor and/or the threshold capturing transistor in the pixel circuit 02. The enable signal in the first-type scanning signal may be a high-level signal.

The first-type signal output module 16 includes a first output module 161 and a second output module 162, the input terminal of the first output module 161 receives the first fixed potential signal VGH, the output terminal of the first output module 161 is electrically connected to the output terminal SN_OUT of the first-type signal output module 16, the input terminal of the second output module 162 receives the second fixed potential signal VGL, and the output terminal of the second output module 162 is electrically connected to the output terminal SN_OUT of the first-type signal output module 16.

The first shift register unit 101 further includes a gating module 17, the first input terminal of the gating module 17 receives the first fixed potential signal VGH, and the second input terminal of the gating module 17 is electrically connected to a gating signal line CTRL.

The control terminal of at least one of the first output module 161 and the second output module 162 is electrically connected to the output terminal of the gating module 17. That is, at least one of the first output module 161 and the second output module 162 may transmit a signal to the output terminal SN_OUT of the first-type signal output module 16 in response to the output signal of the gating module 17.

Exemplarily, as shown in FIG. 6, the first output module 161 includes a sixth transistor T6, the first electrode of the sixth transistor T6 receives the first fixed potential signal VGH, and the second electrode of the sixth transistor T6 is electrically connected to the output terminal SN_OUT of the first-type signal output module 16.

The second output module 162 includes a seventh transistor T7, the first electrode of the seventh transistor T7 receives the second fixed potential signal VGL, and the second electrode of the seventh transistor T7 is electrically connected to the output terminal SN_OUT of the first-type signal output module 16.

In an embodiment, the sixth transistor T6 and the seventh transistor T7 have different channel types.

Exemplarily, the sixth transistor T6 is a P-type transistor, and the seventh transistor T7 is an N-type transistor.

In an embodiment, as shown in FIG. 5, the gating module 17 includes a first sub-module 171 and a second sub-module 172, the input terminal of the first sub-module 171 receives the first fixed potential signal VGH, the control terminal of the first sub-module 171 is electrically connected to the second node N2, and the output terminal of the first sub-module 171 is electrically connected to the control terminal of the first output module 161.

The input terminal of the second sub-module 172 is electrically connected to the gating signal line CTRL, the output terminal of the second sub-module 172 is electrically connected to the control terminal of the first output module 161, and the control terminal of the second sub-module 172 is electrically connected to the output terminal SN_NEXT of the first cascade module 12.

The control terminal of the second output module 162 is electrically connected to the output terminal SN_NEXT of the first cascade module 12.

In an embodiment, the gating module 17 transmits the first fixed potential signal VGH or the signal on the gating signal line CTRL to the control terminal of the first output module 161 in response to the potential of the second node N2 and the first cascade signal output by the first cascade module 12. The first-type signal output module 16 outputs the first-type scanning signal in response to the output signal of the gating module 17 and the first cascade signal output by the first cascade module 12.

Exemplarily, as shown in FIG. 6, the first sub-module 171 includes an eighth transistor T8, the first electrode of the eighth transistor T8 receives the first fixed potential signal VGH, the second electrode of the eighth transistor T8 is electrically connected to the gate of the sixth transistor T6, and the gate of the eighth transistor T8 is electrically connected to the second node N2.

The second sub-module 172 includes a ninth transistor T9, the first electrode of the ninth transistor T9 is electrically connected to the gating signal line CTRL, the second electrode of the ninth transistor T9 is electrically connected to the gate of the sixth transistor T6, and the gate of the ninth transistor T9 is electrically connected to the output terminal SN_NEXT of the first cascade module 12.

The gate of the seventh transistor T7 is electrically connected to the output terminal SN_NEXT of the first cascade module 12.

The eighth transistor T8 and the ninth transistor T9 have the same channel type, and have different channel type from the seventh transistor T7.

Exemplarily, the sixth transistor T6, the eighth transistor T8 and the ninth transistor T9 are all P-type transistors, and the seventh transistor T7 is an N-type transistor.

In an embodiment, the seventh transistor T7 includes a metal oxide, and the seventh transistor T7 may have a top-bottom double-gate structure.

Exemplarily, the bottom gate of the seventh transistor T7 may be electrically connected to the top gate to improve the driving capability of the seventh transistor T7.

When the gating signal line CTRL transmits the high-level signal, both the eighth transistor T8 and the ninth transistor T9 can only transmit the high-level signal to the sixth transistor T6, the sixth transistor T6 remains in an off state, and the output terminal SN_OUT of the first-type signal output module 16 remains outputting the low-level second fixed potential signal VGL. In this case, the first cascade module 12 may output a normal first-stage transmission signal.

When the gating signal line CTRL transmits the low-level signal, the eighth transistor T8 and the ninth transistor T9 may transmit the high-level signal and the low-level signal to the sixth transistor T6, respectively, the sixth transistor T6 may remain in an on state or an off state, and the output terminal SN_OUT of the first-type signal output module 16 may normally output a scanning signal. In this case, the potential of the output terminal SN_NEXT of the first cascade module 12 is opposite to the potential level of the output terminal SN_OUT of the first-type signal output module 16.

Based on this setting manner, the frequency of the enable signal output by the output terminal SN_OUT of the first-type signal output module 16 may be controlled by controlling the signal on the gating signal line CTRL.

Figure 7:
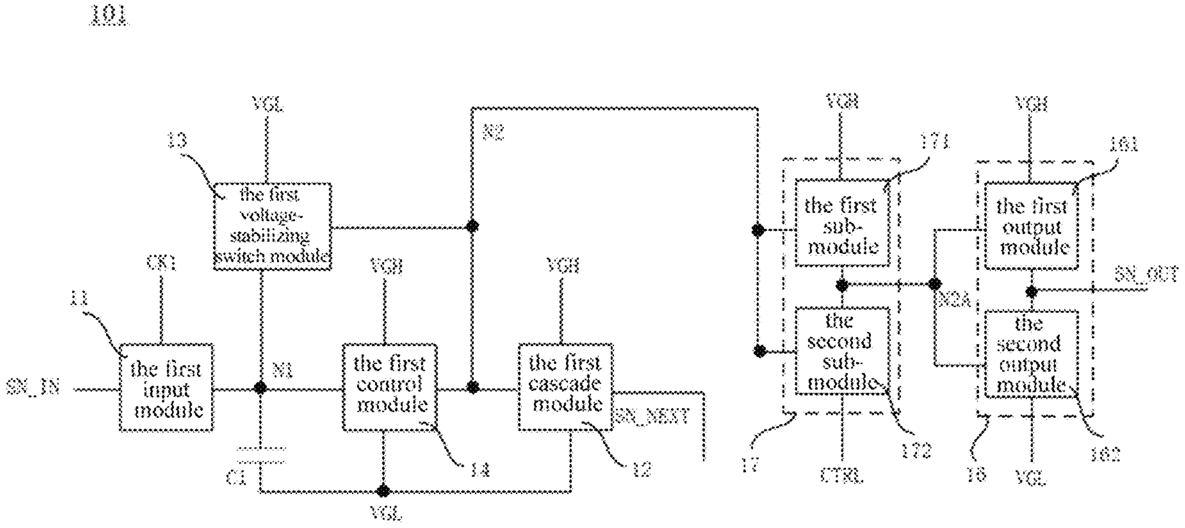
FIG. 7 is a schematic diagram of another first shift register unit according to an embodiment of the present disclosure.
Figure 8:
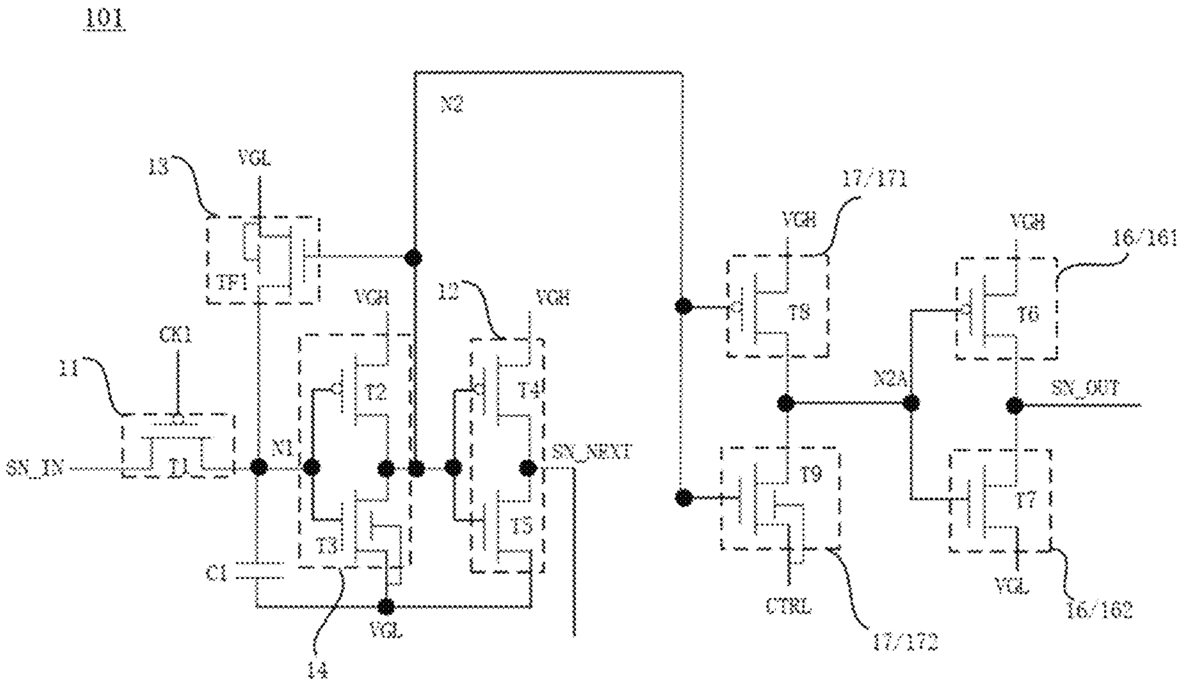
FIG. 8 is a schematic diagram of the first shift register unit shown in FIG. 7.

FIG. 7 is a schematic diagram of still another first shift register unit according to an embodiment of the present disclosure. FIG. 8 is a schematic diagram of the first shift register unit shown in FIG. 7.

In another embodiment, as shown in FIG. 7, the gating module 17 includes the first sub-module 171 and the second sub-module 172, the input terminal of the first sub-module 171 receives the first fixed potential signal VGH, the control terminal of the first sub-module 171 is electrically connected to the second node N2, the output terminal of the first sub-module 171 is electrically connected to a second sub-node N2A, and the second sub-node N2A is electrically connected to the terminals of the first output module 161 and the second output module 162. That is, the output terminal of the first sub-module 171 is electrically connected to the control terminals of the first output module 161 and the second output module 162.

The input terminal of the second sub-module 172 is electrically connected to the gating signal line CTRL, the control terminal of the second sub-module 172 is electrically connected to the second node N2, and the output terminal of the second sub-module 172 is electrically connected to the second sub-node N2A.

In an implementation, the gating module 17 outputs the first fixed potential signal VGH or the signal on the gating signal line CTRL to the control terminal of the first-type signal output module 16 in response to the potential of the second node N2. The first-type signal output module 16 outputs a first-type scanning signal in response to the output signal of the gating module 17, and the first-type scanning signal may include the first fixed potential signal VGH and the second fixed potential signal VGL.

In an embodiment, the potential level of the output terminal SN_OUT of the first-type signal output module 16 may be opposite to the potential level of the output terminal of the gating module 17. As such, during the operation process of the first shift register unit 101, regardless of whether the potential of the output terminal of the gating module 17 is a high-level or a low-level, one of the first output module 161 and the second output module 162 may be turned on, and the potential of the output terminal SN_OUT of the first-type signal output module 16 does not float, which is beneficial to improving the stability of the potential of the output terminal SN_OUT of the first-type signal output module 16.

Exemplarily, as shown in FIG. 8, the first sub-module 171 includes an eighth transistor T8, the first electrode of the eighth transistor T8 receives the first fixed potential signal VGH, the second electrode of the eighth transistor T8 is electrically connected to the gates of the sixth transistor T6 and the seventh transistor T7, and the gate of the eighth transistor T8 is electrically connected to the second node N2.

The second sub-module 172 includes a ninth transistor T9, the first electrode of the ninth transistor T9 is electrically connected to the gating signal line CTRL, the second electrode of the ninth transistor T9 is electrically connected to the gates of the sixth transistor T6 and the seventh transistor T7, and the gate of the ninth transistor T9 is electrically connected to the second node N2.

The eighth transistor T8 and the ninth transistor T9 have different channel types, and the eighth transistor T8 and the sixth transistor T6 have the same channel type.

Exemplarily, the sixth transistor T6 and the eighth transistor T8 are P-type transistors, and the seventh transistor T7 and the ninth transistor T9 are N-type transistors.

In an embodiment, the seventh transistor T7 and the ninth transistor T9 both include metal oxides, and the seventh transistor T7 and the ninth transistor T9 may both have top-bottom double-gate structures.

Exemplarily, as shown in FIG. 8, the bottom gate of the ninth transistor T9 is electrically connected to the first electrode of the ninth transistor T9, so as to improve the stability of the threshold voltage during the long-term operation process of the ninth transistor T9. The bottom gate of the seventh transistor T7 may be electrically connected to the top gate to improve the driving capability of the seventh transistor T7.

When the gating signal line CTRL transmits the high-level signal, both the eighth transistor T8 and the ninth transistor T9 can only transmit the high-level signal to the gates of the sixth transistor T6 and the seventh transistor T7, the sixth transistor T6 remains in the off state, and the output terminal SN_OUT of the first-type signal output module 16 outputs the low-level second fixed potential signal VGL transmitted by the seventh transistor T7. In this case, the first cascade module 12 may output a normal first-stage transmission signal.

When the gating signal line CTRL transmits the low-level signal, the eighth transistor T8 and the ninth transistor T9 may transmit the high-level signal and the low-level signal to the gates of the sixth transistor T6 and the seventh transistor T7, respectively, the sixth transistor T6 may remain in an on state or an off state, and the output terminal SN_OUT of the first-type signal output module 16 may normally output a scanning signal. In this case, the potential of the output terminal SN_NEXT of the first cascade module 12 is opposite to the potential level of the output terminal SN_OUT of the first-type signal output module 16.

Based on this setting manner, the frequency of the enable signal output by the output terminal SN_OUT of the first-type signal output module 16 may be controlled by controlling the signal on the gating signal line CTRL.

In an embodiment, as shown in FIGS. 5 to 8, the first shift register unit 101 further includes a first capacitor C1, one plate of the first capacitor C1 is electrically connected to the first node N1, and another plate receives the second fixed potential signal VGL. In this way, the potential stability of the first node N1 can be further improved by using the first capacitor C1.

Figure 9:
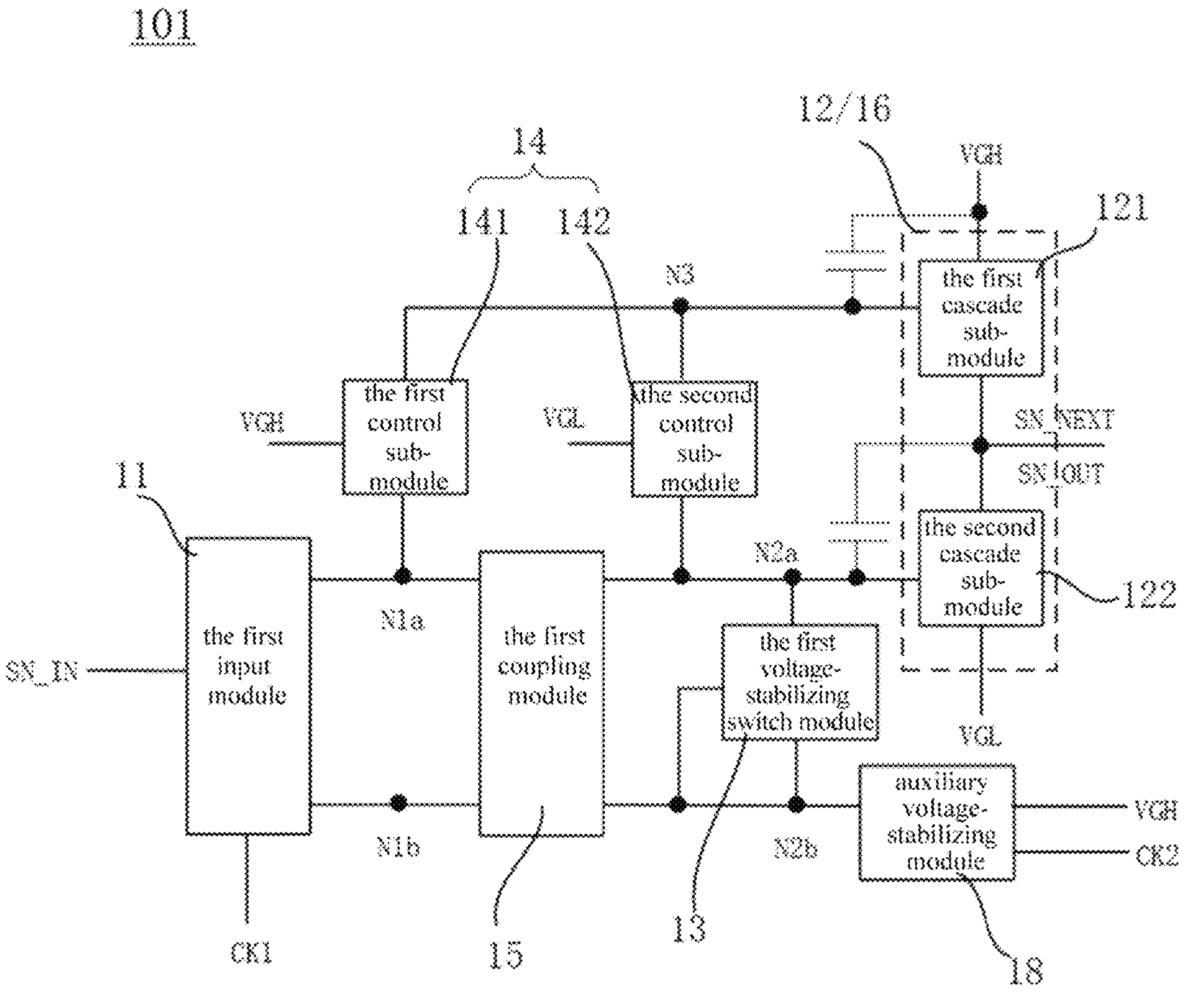
FIG. 9 is a schematic diagram of another first shift register unit according to an embodiment of the present disclosure.
Figure 10:
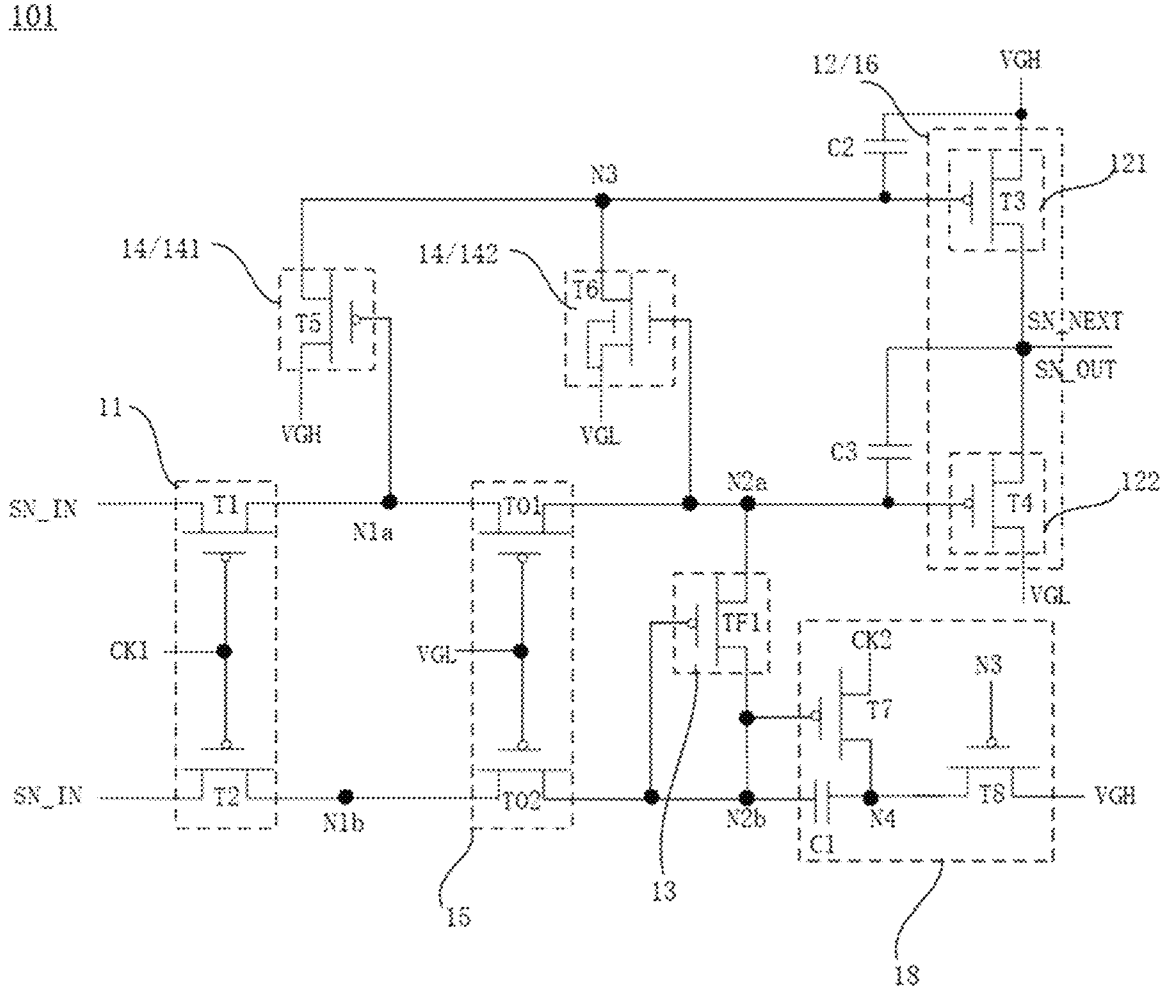
FIG. 10 is a schematic diagram of a first shift register unit shown in FIG. 9.

FIG. 9 is a schematic diagram of another first shift register unit according to an embodiment of the present disclosure. FIG. 10 is a schematic diagram of the first shift register unit shown in FIG. 9.

In an embodiment of the present disclosure, as shown in FIG. 9, the first output terminal of the first input module 11 is electrically connected to a first primary node N1*a*, the second output terminal of the first input module 11 is electrically connected to the first secondary node N1*b*, the control terminal of the first input module 11 receives the first clock signal CK1, the first primary node N1*a* is coupled to the second primary node N2*a*, and the first secondary node N1*b* is coupled to the second secondary node N2*b*. A first coupling module 15 is arranged between the first primary node N1*a* and the second primary node N2*a*, and the first coupling module 15 is arranged between the first secondary node N1*b* and the second secondary node N2*b*.

The first cascade module 12 includes a first cascade sub-module 121 and a second cascade sub-module 122, the input terminal of the first cascade sub-module 121 receives the first fixed potential signal VGH, the output terminal of the first cascade sub-module 121 is electrically connected to the output terminal SN_NEXT of the first cascade module 12, and the control terminal of the first cascade sub-module 121 is electrically connected to the third node N3. The input terminal of the second cascade sub-module 122 receives the second fixed potential signal VGL, the output terminal of the second cascade sub-module 122 is electrically connected to the output terminal SN_NEXT of the first cascade module 12, and the control terminal of the second cascade sub-module 122 is electrically connected to the second primary node N2*a*.

The first shift register unit 101 further includes a first control module 14, the first control module 14 includes a first control sub-module 141 and a second control sub-module 142, the input terminal of the first control sub-module 141 receives the first fixed potential signal VGH, the output terminal of the first control sub-module 141 is electrically connected to the third node N3, and the control terminal of the first control sub-module 141 is electrically connected to the first primary node N1*a*. The input terminal of the second control sub-module 142 receives the second fixed potential signal VGL, the output terminal of the second control sub-module 142 is electrically connected to the third node N3, and the control terminal of the second control sub-module 142 is electrically connected to the second primary node N2.

In an embodiment, the first sub-control module 141 may transmit the first fixed potential signal VGH to the third node N3 in response to the potential of the first primary node N1*a*, and the second sub-control module 142 may transmit the second fixed potential signal VGL to the third node in response to the potential of the second primary node N2*a*. The first cascade sub-module 121 may transmit the first fixed potential signal VGH to the output terminal SN_NEXT of the first cascade module 12 in response to the potential of the third node N3, and the second sub-cascade sub-module 122 may transmit the second fixed potential signal VGL to the output terminal SN_NEXT of the first cascade module 12 in response to the potential of the second primary node N2*a*. The first fixed potential signal VGH or the second fixed potential signal VLG output by the output terminal SN_NEXT of the first cascade module 12 may be used as the first cascade signal.

In an embodiment, the input terminal of the first voltage-stabilizing switch module 13 is electrically connected to the second secondary node N2*b*, the output terminal of the first voltage-stabilizing switch module 13 is electrically connected to the second primary node N2*a*, and the control terminal of the first voltage-stabilizing switch module 13 is electrically connected to the second secondary node N2*b*.

Based on this arrangement, the first voltage-stabilizing switch module 13 may transmit the potential of the second secondary node N2*b* to the second primary node N2*a*, and since the potential of the first primary node N1*a* may be the same as the potential of the first secondary node N1*b*, the second primary node N2*a* is coupled to the first primary node N1*a*, and the second secondary node N2*b* is coupled to the first secondary node N1*b*, the potential of the second primary node N2*a* may be stabilized by using the potential of the second secondary node N2*b*, so as to avoid the problem that the potential of the second primary node N2*a* is not low enough when the potentials of the first primary node N1*a* and the first secondary node N1*b* are the low-level.

Exemplarily, as shown in FIG. 10, the first input module 11 includes a first transistor T1 and a second transistor T2, the first electrode of the first transistor T1 receives the first trigger signal SN_IN, the second electrode of the first transistor T1 is electrically connected to the first primary node N1*a*, the gate of the first transistor T1 receives the first clock signal CK1, the first electrode of the second transistor T2 receives the first trigger signal SN_IN, the second electrode of the second transistor T2 is electrically connected to the first secondary node N1*b*, and the gate of the second transistor T2 receives the first clock signal CK1, during the operation process of the first shift register unit 101, the potentials of the first primary node N1*a* and the first secondary node N1*b* can be substantially the same.

The first cascade sub-module 121 includes the third transistor T3, the first electrode of the third transistor T3 receives the first fixed potential signal VGH, the second electrode of the third transistor T3 is electrically connected to the output terminal SN_NEXT of the first cascade module 12, and the gate of the third transistor T3 is electrically connected to the third node N3. The second cascade sub-module 122 includes the fourth transistor T4, the first electrode of the fourth transistor T4 receives the second fixed potential signal VGL, the second electrode of the fourth transistor T4 is electrically connected to the output terminal SN_NEXT of the first cascade module 12, and the gate of the fourth transistor T4 is electrically connected to the second primary node N2*a*.

The first control sub-module 141 includes the fifth transistor T5, the first electrode of the fifth transistor T5 receives the first fixed potential signal VGH, the second electrode of the fifth transistor T5 is electrically connected to the third node N3, and the gate electrode of the fifth transistor T5 is electrically connected to the first primary node N1*a*. The second control sub-module 142 includes the sixth transistor T6, the first electrode of the sixth transistor T6 receives the second fixed potential signal VGH, the second electrode of the sixth transistor T6 is electrically connected to the third node N3, and the gate of the sixth transistor T6 is electrically connected to the second primary node N2*a*.

The first voltage-stabilizing switch module 13 includes a first voltage-stabilizing transistor TF1, the first electrode of the first voltage-stabilizing transistor TF1 is electrically connected to the second secondary node N2*b*, the second electrode of the first voltage-stabilizing transistor TF1 is electrically connected to the second primary node N2*a*, and the gate of the first voltage-stabilizing transistor TF1 is electrically connected to the second secondary node N2*b*.

In an embodiment, the first transistor T1, the second transistor T2, the third transistor T3, the fourth transistor T4, the fifth transistor T5 and the first voltage-stabilizing transistor TF1 have the same channel type and have different channel types from the sixth transistor T6.

Exemplarily, the first transistor T1, the second transistor T2, the third transistor T3, the fourth transistor T4, the fifth transistor T5 and the first voltage-stabilizing transistor TF1 are all P-type transistors, and the sixth transistor T6 is an N-type transistor.

In an embodiment, the sixth transistor T6 includes a metal oxide, and the sixth transistor T6 may have a top-bottom double-gate structure.

Exemplarily, as shown in FIG. 10, the bottom gate of the sixth transistor T6 is electrically connected to the first electrode of the sixth transistor T6, so as to improve the stability of the threshold voltage of the sixth transistor T6 during long-term operation process.

Based on this arrangement, it is advantageous that the first cascade module 12 outputting the first cascade signal may include only a P-type transistor without an N-type transistor, which facilitates improving the signal output capability of the first cascade module 12, and, in particular, facilitates avoiding the problem of poor signal output capability and large occupied space caused by using a transistor including a metal oxide (for example, indium gallium zinc oxide) as a signal output tube.

Still referring to FIG. 10, in an embodiment of the present disclosure, the first coupling transistor TO1 is arranged between the first primary node N1*a* and the second primary node N2*a*, the second coupling transistor TO2 is arranged between the first secondary node N1*b* and the second secondary node N2*b*, and both the gate of the first coupling transistor TO1 and the gate of the second coupling transistor TO2 receive the second fixed potential signal VGL.

In an embodiment, the first coupling transistor TO1 and the second coupling transistor TO2 have the same channel type, and the first coupling transistor TO1 and the second coupling transistor TO2 may remain in an ON state during the operation process of the first shift register unit 101.

Exemplarily, both the first coupling transistor TO1 and the second coupling transistor TO2 are P-type transistors.

In this implementation, the setting of the first coupling transistor TO1 and the second coupling transistor TO2 is beneficial to stabilizing the potentials of the first primary node N1*a* and the first secondary node N1*b*. When the potential of the second primary node N2*a* is disturbed, the first coupling transistor TO1 may reduce the influence of the disturbance on the first primary node N1*a*, and when the potential of the second secondary node N2*b* is disturbed, the second coupling transistor TO1 may reduce the influence of the disturbance on the first secondary node N1*b*. That is, it is advantageous that the influence on the potential of the output terminal of the first input module 11 may be reduced, and the potential of the output terminal of the first input module 11 may be stabilized.

In an embodiment, as shown in FIG. 9, the first shift register unit 101 further includes an auxiliary voltage-stabilizing module 18, the first input terminal of the auxiliary voltage-stabilizing module 18 receives the first fixed potential signal VGH, the second input terminal of the auxiliary voltage-stabilizing module 18 receives the second clock signal CK2, the output terminal of the auxiliary voltage-stabilizing module 18 is electrically connected to the second secondary node N2*b*, and the auxiliary voltage-stabilizing module 18 is used for adjusting the potential of the second secondary node N2*b*, and further for stabilizing the potential of the second primary node N2*a* through the first voltage-stabilizing transistor TF1.

Exemplarily, as shown in FIG. 10, the auxiliary voltage-stabilizing module 18 includes a first capacitor C1, the seventh transistor T7 and the eighth transistor T8. The seventh transistor T7 and the eighth transistor T8 have the same channel type.

One plate of the first capacitor C1 is electrically connected to the second secondary node N2*b*, another plate of the first capacitor C1 is electrically connected to the fourth node N4, the first electrode of the seventh transistor T7 receives the second clock signal CK2, the second electrode of the seventh transistor T7 is electrically connected to the fourth node N4, and the gate of the seventh transistor T7 is electrically connected to the second secondary node N2*b*, the first electrode of the eighth transistor T8 receives the first fixed potential signal VGH, the second electrode is electrically connected to the fourth node N4, and the gate is electrically connected to the third node N3.

Exemplarily, both the seventh transistor T7 and the eighth transistor T8 are P-type transistors.

When the first primary node N1*a* and the first secondary node N1*b* are the low-level, the second primary node N2*a* and the second secondary node N2*b* are the low-level, at this time, the fifth transistor T5 is turned on, the sixth transistor T6 is turned off, and the third node N3 is the high-level. At the same time, the potential of the third node N3 controls the eighth transistor T8 to be turned off, and the potential of the second secondary node N2*b* controls the seventh transistor T7 to be turned on. The second clock signal CK2 is a pulse signal, and the level change of the second clock signal CK2 may pull down the potential of the fourth node N4, then pull down the potential of the second secondary node N2*b* through the first capacitor C1, and further pull down the potential of the second primary node N2*a* through the first voltage-stabilizing transistor TF1, so that the second primary node N2*a* has a stable low potential to avoid the problem that the sixth transistor T6 is not completely turned off and the fourth transistor T4 is not completely turned on due to the fact that the potential of the second primary node N2*a* is not sufficiently low.

In an implementation of the present disclosure, referring to FIG. 9 and FIG. 10, the first cascade module 12 is further configured to output a first-type scanning signal. That is, the first-stage transmission signal output by the output terminal SN_NEXT of the first cascade module 12 may be reused as the first-type scanning signal output by the first shift register unit 101.

The first cascade module 12 may be reused as the first-type signal output module 16 in the first shift register unit 101, and the output terminal SN_NEXT of the first cascade module 12 is reused as the output terminal SN_OUT of the first-type signal output module 16, to simultaneously transmit the first cascade signal to the next-stage first shift register unit 101 and the first-type scanning signal to the pixel circuit 02.

Based on this arrangement, it is advantageous to reduce the number of transistors in the first shift register unit 101, and thus the occupied area of the first shift register unit 101, which not only simplifies the structure of the first shift register unit 101, but also facilitates the implementation of a narrow bezel of the display panel 200.

In an embodiment, as shown in FIG. 10, the first shift register unit 101 further includes a second capacitor C2 and a third capacitor C3, one plate of the second capacitor C2 receives the first fixed potential signal VGH, and another plate is electrically connected to the control terminal of the first cascade sub-module 121, to stabilize the potential of the control terminal of the first cascade sub-module 121.

One plate of the third capacitor C3 is electrically connected to the output terminal SN_NEXT of the first cascade module 12, and another plate is electrically connected to the control terminal of the second cascade sub-module 122, so as to further stabilize the potential of the control terminal of the second cascade sub-module 122.

Figure 11:
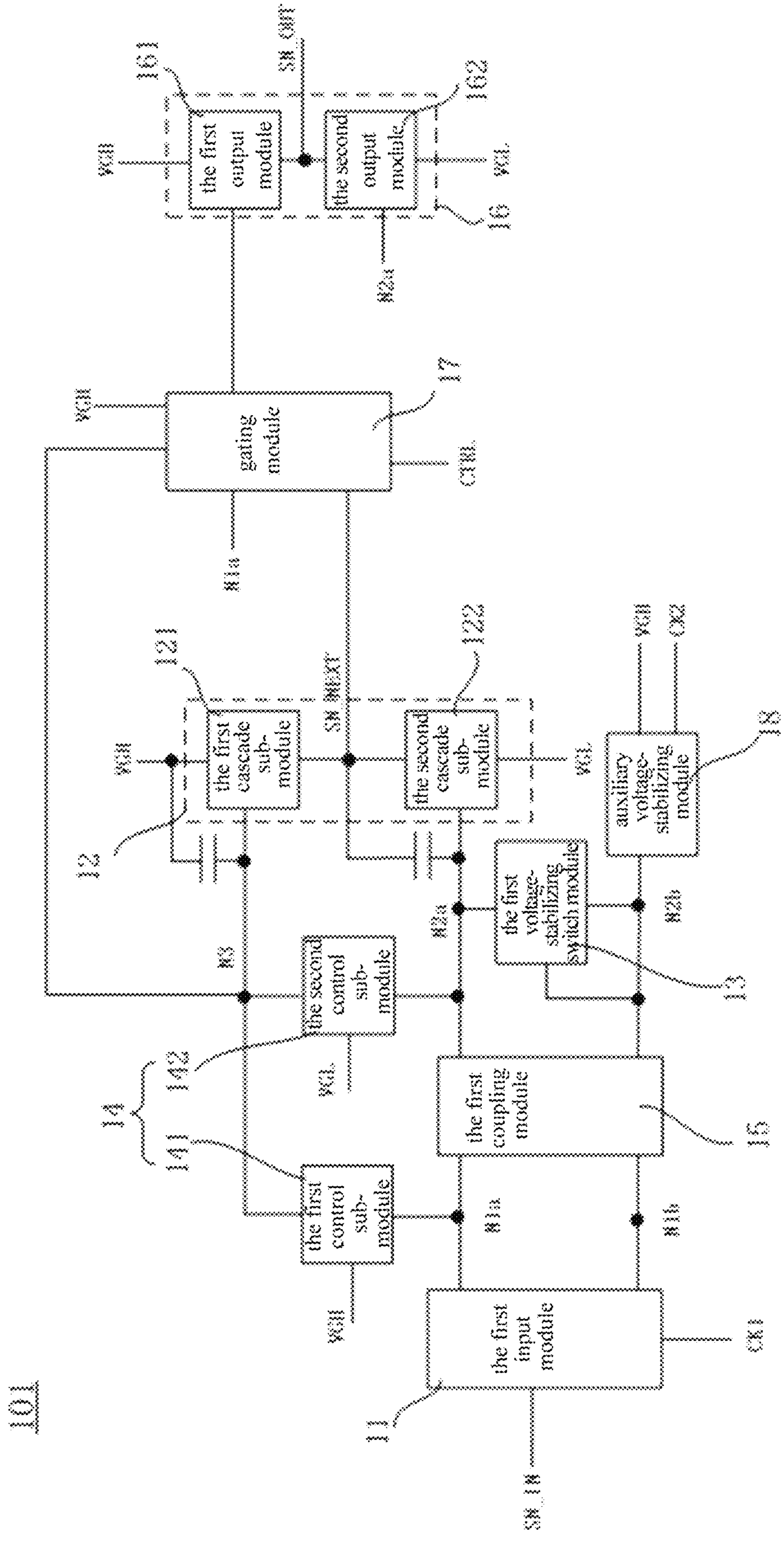
FIG. 11 is a schematic diagram of another first shift register unit according to an embodiment of the present disclosure.
Figure 12:
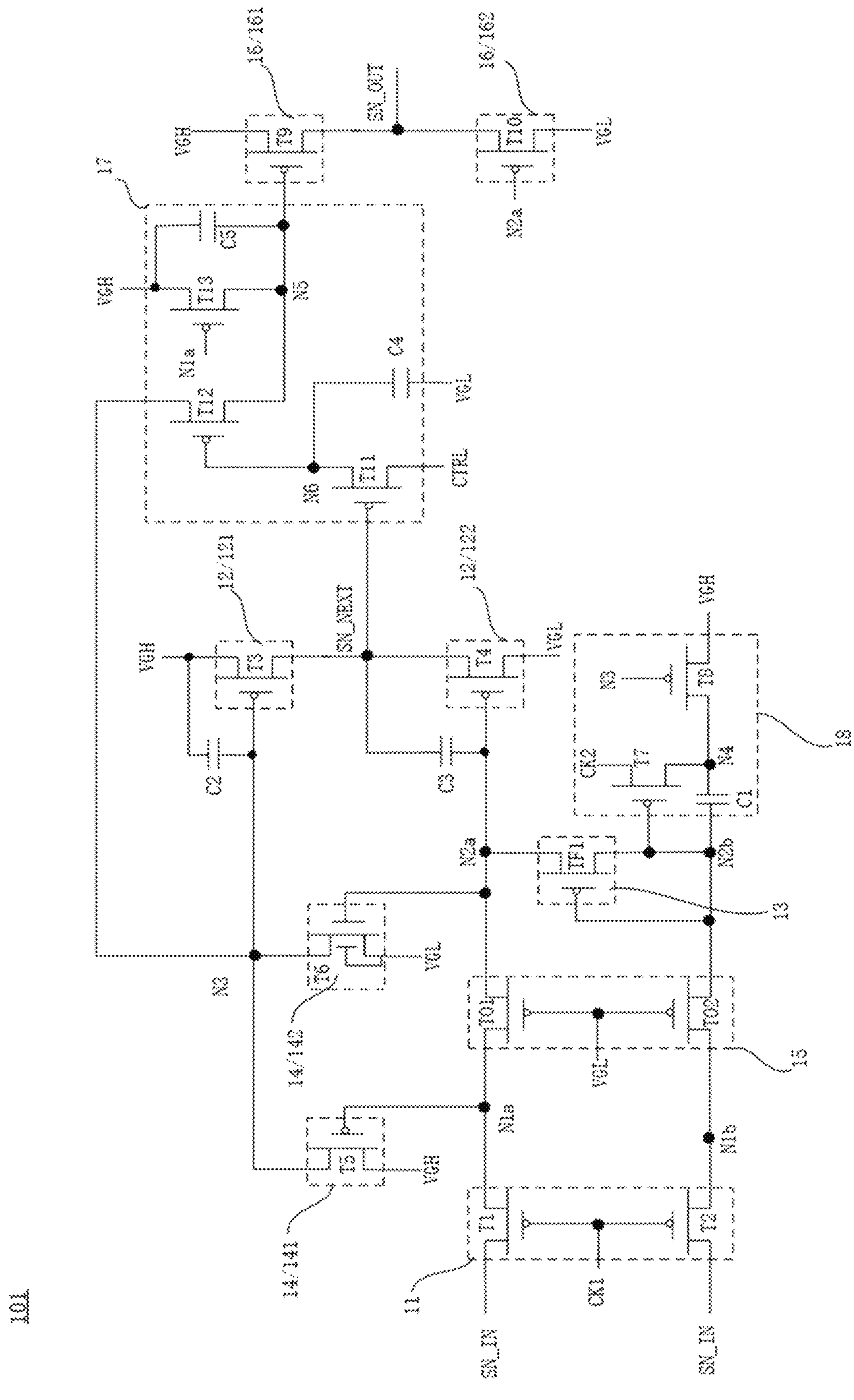
FIG. 12 is a schematic diagram of a first shift register unit shown in FIG. 11.

FIG. 11 is a schematic diagram of another first shift register unit according to an embodiment of the present disclosure. FIG. 12 is a schematic diagram of the first shift register unit shown in FIG. 11.

In an embodiment of the present disclosure, as shown in FIG. 11, the first shift register unit 101 further includes the gating module 17 and the first-type signal output module 16, and the output terminal SN_OUT of the first-type signal output module 16 is configured to output the first-type scanning signal.

The first-type signal output module 16 includes the first output module 161 and the second output module 162, the input terminal of the first output module 161 receives the first fixed potential signal VGH, the output terminal of the first output module 161 is electrically connected to the output terminal SN_OUT of the first-type signal output module 16, the control terminal of the first output module 161 is electrically connected to the output terminal SN_OUT of the gating module 17, the input terminal of the second output module 162 receives the second fixed potential signal VGL, the output terminal of the second output module 162 is electrically connected to the output terminal SN_OUT of the first-type signal output module 16, and the control terminal of the second output module 162 is electrically connected to the second primary node N2*a*.

The first input terminal of the gating module 17 is electrically connected to the gating signal line CTRL, the second input terminal of the gating module 17 is electrically connected to the third node N3, the third input terminal of the gating module 17 receives the first fixed potential signal VGH, and the gating module 17 transmits the control signal to the first output module 161 in response to the first primary node N1*b* and the potential of the output terminal of the first cascade module 12.

In an implementation, the first-type signal output module 16 outputs the first-type scanning signal in response to the potential of the output terminal of the gating module 17 and the potential of the second primary node N2*a*, which is beneficial to control the frequency of the enable signal output by the output terminal SN_OUT of the first-type signal output module 16 by adjusting the output signal of the gating module 17.

Exemplarily, as shown in FIG. 12, the first output module 161 includes the ninth transistor T9, the first electrode of the ninth transistor T9 receives the first fixed potential signal VGH, the second electrode of the ninth transistor T9 is electrically connected to the output terminal SN_OUT of the first-type signal output module 16, and the gate of the ninth transistor T9 is electrically connected to the fifth node N5. The second output module 162 includes a tenth transistor T10, the first electrode of the tenth transistor T10 receives the second fixed potential signal VGL, the second electrode of the tenth transistor T10 is electrically connected to the output terminal SN_OUT of the first-type signal output module 16, and the gate electrode of the tenth transistor T10 is electrically connected to the second primary node N2*a*.

The gating module 17 includes an eleventh transistor T11, a twelfth transistor T12, a thirteenth transistor T13, a fourth capacitor C4, and a fifth capacitor C5. The first electrode of the eleventh transistor T11 is electrically connected to the gating signal line CTRL, the second electrode of the eleventh transistor T11 is electrically connected to the sixth node N6, and the gate of the eleventh transistor T11 is electrically connected to the output terminal SN_NEXT of the first cascade module 12, the first electrode of the twelfth transistor T12 is electrically connected to the third node N3, the second electrode of the twelfth transistor T12 is electrically connected to the fifth node N5, and the gate of the twelfth transistor T12 is electrically connected to the sixth node N6, the first electrode of the thirteenth transistor T13 receives the first fixed potential signal VGH, the second electrode of the thirteenth transistor T13 is electrically connected to the fifth node N5, and the gate of the thirteenth transistor T13 is electrically connected to the first primary node N1*a*.

One plate of the fourth capacitor C4 receives the second fixed potential signal VGL, and another plate is electrically connected to the sixth node N6 to improve the stability of the potential of the sixth node N6. One plate of the fifth capacitor C5 receives the first fixed potential signal VGH, and another plate is electrically connected to the fifth node N5 to improve the stability of the potential of the fifth node N5.

In an embodiment, the ninth transistor T9, the tenth transistor T10, the eleventh transistor T11, the twelfth transistor T12. The thirteenth transistor T13 have the same channel type.

Exemplarily, the ninth transistor T9, the tenth transistor T10, the eleventh transistor T11, the twelfth transistor T12 and the thirteenth transistor T13 are all P-type transistors.

When the gating signal line CTRL transmits the high-level signal, the sixth node N6 may only remain the high-level, the eleventh transistor T11 remains in the off state, the fifth node N5 may only receive the high-level first fixed potential signal VGH transmitted by the twelfth transistor T12, the eighth transistor T8 remains in the off state, and the output terminal SN_OUT of the first-type signal output module 16 may only output the low-level second fixed potential signal VGL transmitted by the ninth transistor T9.

When the gating signal line CTRL transmits the low-level signal, the eleventh transistor T11 and the twelfth transistor T12 may transmit the potential of the third node N3 and the first fixed potential signal VGH to the fifth node N5 respectively, and the potential of the third node N3 may be the high-level or the low-level. Therefore, the fifth node N5 may remain the high-level potential or the low-level potential, the eighth transistor T8 may remain in an on state or an off state, and the output terminal SN_OUT of the first-type signal output module 16 may normally output the scanning signal. The potential of the output terminal SN_OUT of the first-type signal output module 16 may be the same as the potential of the output terminal SN_NEXT of the first cascade module 12.

As such, the frequency of the enable signal output by the output terminal SN_OUT of the first-type signal output module 16 may be controlled by controlling the signal on the gating signal line CTRL.

Figure 13:
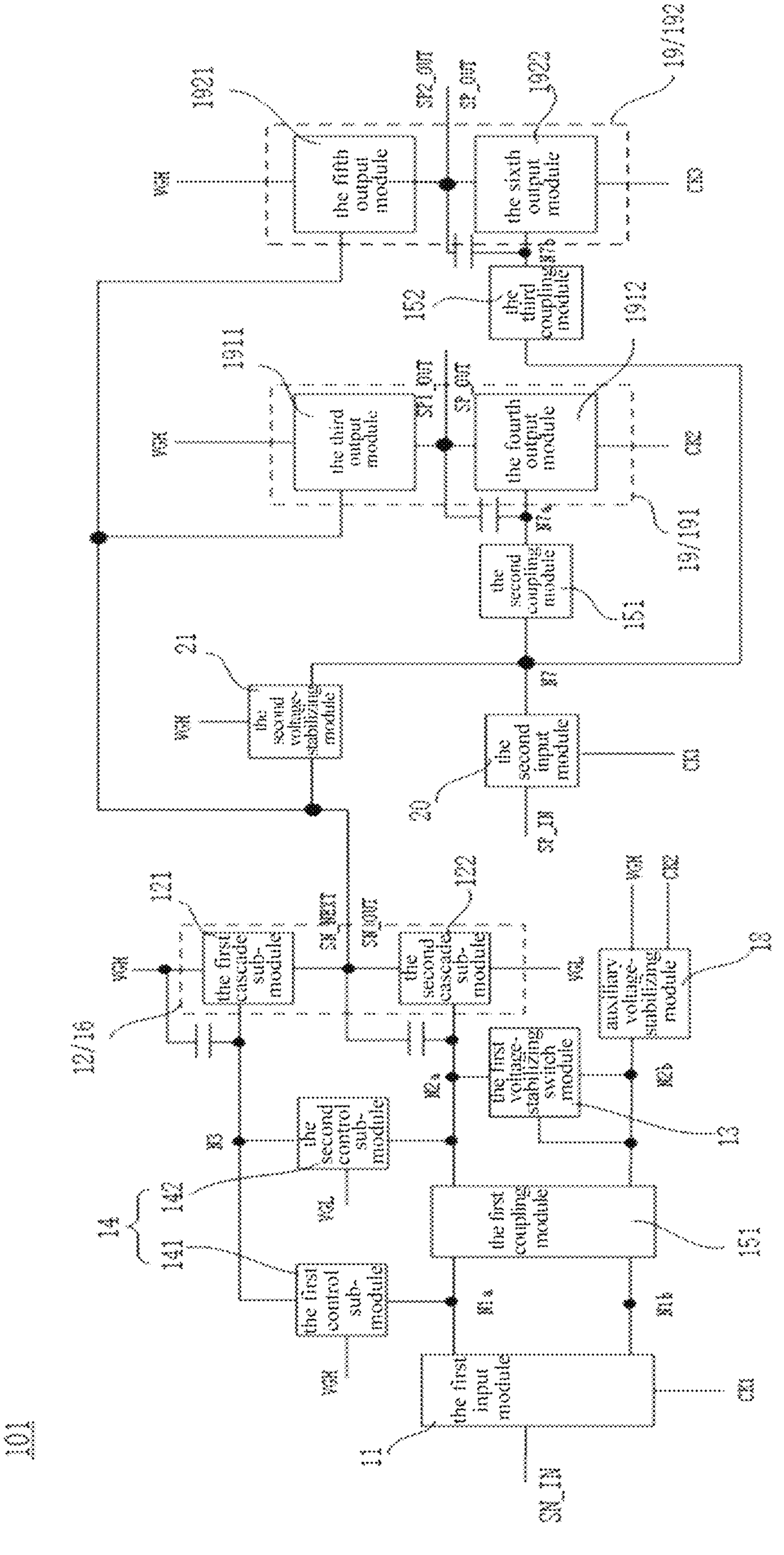
FIG. 13 is a schematic diagram of another first shift register unit according to an embodiment of the present disclosure.
Figure 14:
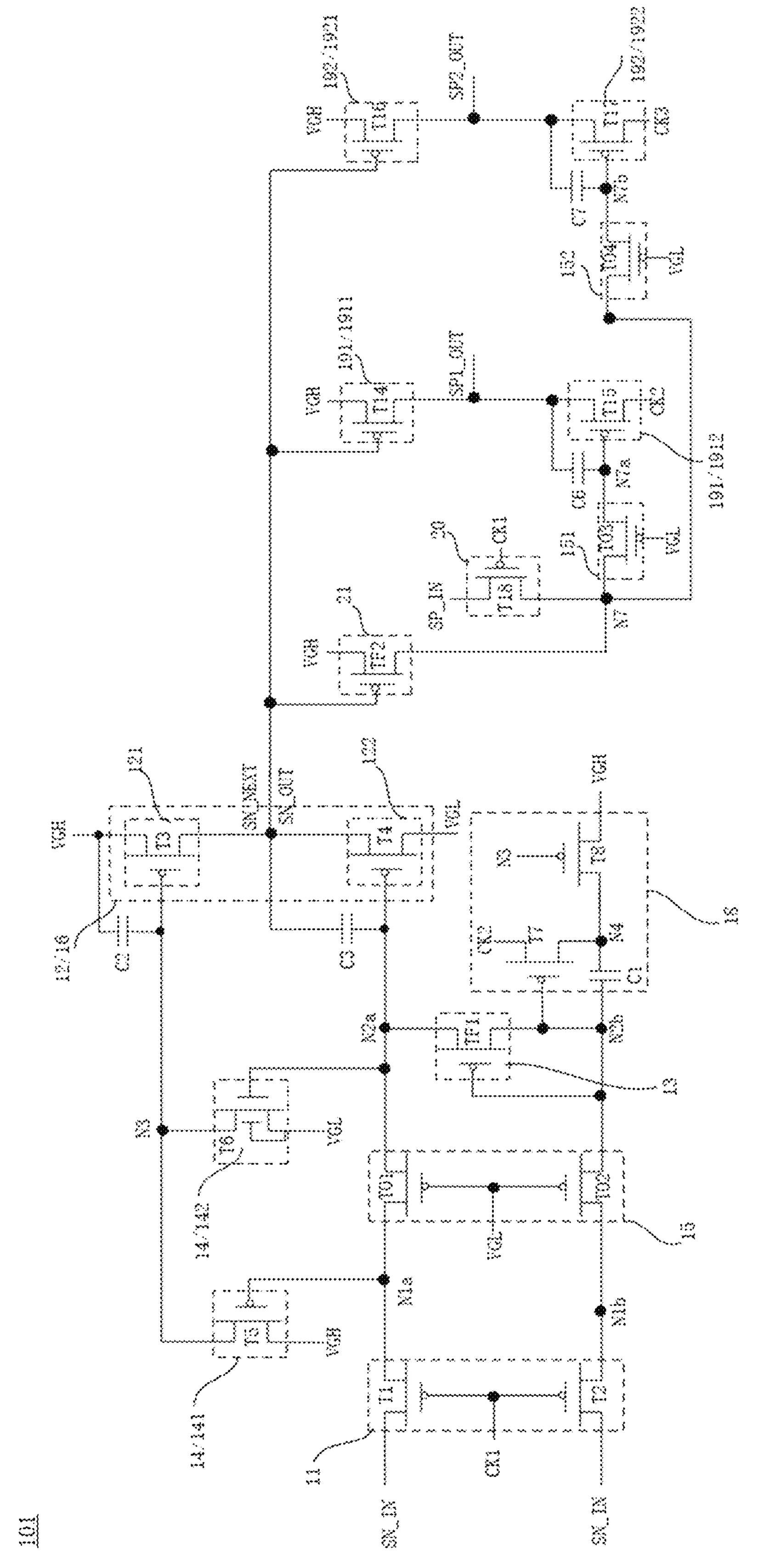
FIG. 14 is a schematic diagram of a first shift register unit shown in FIG. 13.

FIG. 13 is a schematic diagram of another first shift register unit according to an embodiment of the present disclosure. FIG. 14 is a schematic diagram of the first shift register unit shown in FIG. 13.

In an embodiment of the present disclosure, as shown in FIG. 13 and FIG. 14, the first shift register unit 101 further includes a second-type signal output module 19, and the output terminal SP_OUT of the second-type signal output module 19 is configured to output a second-type scanning signal. The second-type scanning signal may be a gate scanning signal received by the data writing transistor in the pixel circuit. That is, the second-type signal output module 19 may be used for increasing the gate scanning signal to the data writing transistor in the pixel circuit. The enable signal output by the output terminal SP_OUT of the second-type signal output module 19 may be a low-level signal.

Figure 15:
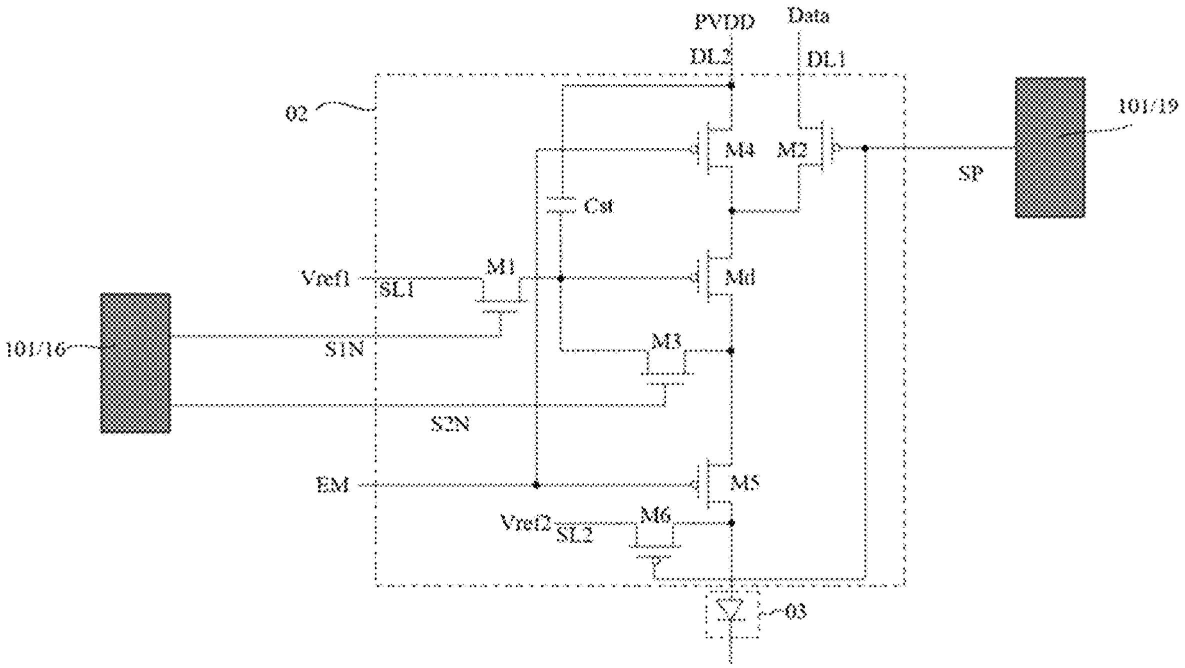
FIG. 15 is a connection schematic diagram of a pixel circuit according to an embodiment of the present disclosure.

Exemplarily, FIG. 15 is a connection schematic diagram of a pixel circuit according to an embodiment of the present disclosure. As shown in FIG. 15, a structure of the pixel circuit shown in FIG. 15 may be the same as a structure of the pixel circuit shown in FIG. 3. In an embodiment, the first-type signal output module 16 in the first shift register unit 101 is electrically connected to the first scan line S1N and the third scan line S2N in the pixel circuit 02, and the first-type signal output module 16 may provide the scanning signal to the gate of the gate reset transistor M1 through the first scan line S1N, and provide the scanning signal to the gate of the threshold capturing transistor M3 through the third scan line S2N.

The second-type signal output module 19 in the first shift register unit 101 is electrically connected to the second scan line SP in the pixel circuit 02, and the second-type signal output module 19 may provide a scanning signal to the gate of the data writing transistor M2 through the second scan line SP.

The second-type signal output module 19 includes a first scanning signal output module 191 and a second scanning signal output module 192, and the first scanning signal output module 191 and the second scanning signal output module 192 may be electrically connected to gates of data writing transistors M2 of pixel circuits 02 of different rows, respectively.

Exemplarily, the first scanning signal output module 191 and the second scanning signal output module 192 are electrically connected to the gates of the data writing transistors M2 of pixel circuits 02 of two adjacent rows. The first shift register unit 101 may drive pixel circuits of two adjacent rows.

The first scanning signal output module 191 includes a third output module 1911 and a fourth output module 1912. The input terminal of the third output module 1911 receives the first fixed potential signal VGH, the output terminal of the third output module 1911 is electrically connected to the output terminal SP_OUT1 of the first scanning signal output module 191, and the control terminal of the third output module 1911 is electrically connected to the output terminal SN_NEXT of the first cascade module 12. The input terminal of the fourth output module 1912 receives the second clock signal CK2, and the output terminal of the fourth output module 1912 is electrically connected to the output terminal SP_OUT1 of the first scanning signal output module 191.

The second scanning signal output module 192 includes a fifth output module 1921 and a sixth output module 1922. The input terminal of the fifth output module 1921 receives the first fixed potential signal VGH, the output terminal of the fifth output module 1921 is electrically connected to the output terminal SP_OUT2 of the second scanning signal output module 192, and the control terminal of the fifth output module 1921 is electrically connected to the output terminal SN_NEXT of the first cascade module 12. The input terminal of the sixth output module 1922 receives a third clock signal CK3, and the output terminal of the sixth output module 1922 is electrically connected to the output terminal SP_OUT1 of the second scanning signal output module 192.

It should be noted that both the output terminal SP1_OUT of the first scanning signal output module 191 and the output terminal SP2_OUT of the second scanning signal output module 192 may be the output terminal SP_OUT of the second-type signal output module 19.

The first shift register unit 101 further includes the second input module 20 and a second voltage-stabilizing switch module 21, the input terminal of the second input module 20 receives the second trigger signal SP_IN, the output terminal of the second input module 20 is electrically connected to the seventh node N7, the control terminal of the second input module 20 receives the first clock signal CK1, and the seventh node N7 is coupled to the control terminal of the fourth output module 1912 and the control terminal of the sixth output module 1922. A second coupling module 151 may be arranged between the seventh node N7 and the control terminal of the fourth output module 1912, and a third coupling module 152 may be arranged between the seventh node N7 and the control terminal of the sixth output module 1922. The signal output by the output terminal SP_OUT2 of the second scanning signal output module 192 in the proceeding stage of first shift register unit 101 may be the second trigger signal SP_IN received by the second input module 20 in the subsequent stage of the first shift register unit 101.

In an embodiment, the input terminal of the second voltage-stabilizing switch module 21 receives the first fixed potential signal VGH, the output terminal of the second voltage-stabilizing switch module 21 is electrically connected to the seventh node N7, and the control terminal of the second voltage-stabilizing switch module 21 is electrically connected to the output terminal SN_NEXT of the first cascade module 12.

In an embodiment, the first shift register unit 101 may output both the first-type scanning signal and the second-type scanning signal, which is beneficial to reducing the number of groups of peripheral scanning circuits required by the pixel circuit 02. When the scanning circuit 100 and the pixel circuit 02 are applied to the display panel 200, it is beneficial to reduce the area occupied by the peripheral scanning circuit, thereby facilitating the implementation of a narrow bezel of the display panel 200. Moreover, reducing the number of groups of peripheral scanning circuits required by the pixel circuit 02 may also reduce the number of clock signals required by the peripheral scanning circuits, which is beneficial to reducing the power consumption of the display panel 200.

In addition, the output terminal of the second voltage-stabilizing switch module 21 is arranged to be electrically connected to the seventh node N7, so that the second voltage-stabilizing switch module 21 may be controlled to be turned on during the period in which the second input module 20 transmits the high-level to the seventh node N7, and the second voltage-stabilizing switch module 21 may transmit the high-level first fixed potential signal VGH to the seventh node N7, thereby improving the stability of the potential of the seventh node N7, that is, improving the potential stability of the output terminal of the second input module 16, and further stabilizing the control terminal of the fourth output module 1912 and the control terminal of the sixth output module 1922 to a high potential, which is beneficial to improving the coupling effect of the second clock signal CK2 on the control terminal of the fourth output module 1912 and the coupling effect of the third clock signal CK3 on the control terminal of the sixth output module 1922.

Exemplarily, as shown in FIG. 14, the third output module 1911 includes a fourteenth transistor T14, the first electrode of the fourteenth transistor T14 receives the first fixed potential signal VGH, the second electrode of the fourteenth transistor T14 is electrically connected to the output terminal SP_OUT1 of the first scanning signal output module 191, and the gate of the fourteenth transistor T14 is electrically connected to the output terminal SN_NEXT of the first cascade module 12. The fourth output module 1912 includes a fifteenth transistor T15, the first electrode of the fifteenth transistor T15 receives the second clock signal CK2, the second electrode of the fifteenth transistor T15 is electrically connected to the output terminal SP_OUT1 of the first scanning signal output module 191, and the gate of the fifteenth transistor T15 is coupled to the seventh node N7.

The fifth output module 1921 includes a sixteenth transistor T16, the first electrode of the sixteenth transistor T16 receives the first fixed potential signal VGH, the second electrode of the sixteenth transistor T16 is electrically connected to the output terminal SP_OUT2 of the second scanning signal output module 192, and the gate electrode of the sixteenth transistor T16 is electrically connected to the output terminal SN_NEXT of the first cascade module 12. The sixth output module 1922 includes a seventeenth transistor T17, the first electrode of the seventeenth transistor T17 receives the third clock signal CK3, the second electrode of the seventeenth transistor T17 is electrically connected to the output terminal SP_OUT2 of the second scanning signal output module 192, and the gate of the seventeenth transistor T17 is coupled to the seventh node N7.

The second input module 20 comprises an eighteenth transistor T18. The first electrode of the eighteenth transistor T18 receives the second trigger signal SP_IN, the second electrode of the eighteenth transistor T18 is electrically connected to the seventh node N7, and the gate of the eighteenth transistor T18 receives the first clock signal CK1;

The second voltage-stabilizing switch module 21 includes a second voltage-stabilizing transistor TF2. The first electrode of the second voltage-stabilizing transistor TF2 receives the first fixed-point signal VGH, the second electrode of the second voltage-stabilizing transistor TF2 is electrically connected to the seventh node N7, and the gate electrode of the second voltage-stabilizing transistor TF2 is electrically connected to the output terminal SN_NEXT of the first cascade module 12.

In an embodiment, the fourteenth transistor T14, the fifteenth transistor T15, the sixteenth transistor T16, the seventeenth transistor T17, the eighteenth transistor T18, and the second voltage-stabilizing transistor TF2 have the same channel type.

Exemplarily, the fourteenth transistor T14, the fifteenth transistor T15, the sixteenth transistor T16, the seventeenth transistor T17, the eighteenth transistor T18, and the second voltage-stabilizing transistor TF2 are all P-type transistors.

Still referring to FIG. 14, in an embodiment of the present disclosure, the control terminal of the fourth output module 1912 is electrically connected to the seventh secondary node I N7*a*, and a third coupling transistor TO3 is arranged between the seventh node N7 and the seventh secondary node I N7*a*, that is, the third coupling transistor TO3 is arranged between the seventh node N7 and the control terminal of the fourth output module 1912. The control terminal of the sixth output module 1922 is electrically connected to the seventh secondary node II N7*b*, and a fourth coupling transistor TO4 is arranged between the seventh node N7 and the seventh secondary node II N7*b*. That is, the fourth coupling transistor TO4 is arranged between the seventh node N7 and the control terminal of the sixth output module 1922. The gate of the third coupling transistor TO3 and the gate of the fourth coupling transistor TO4 both receive the second fixed potential signal VGL.

In an embodiment, the third coupling transistor TO3 and the fourth coupling transistor TO4 have the same channel type. During operation process of the first shift register unit 101, the third coupling transistor TO3 and the fourth coupling transistor TO4 may remain in the on state.

Exemplarily, both the third coupling transistor TO3 and the fourth coupling transistor TO4 are P-type transistors.

In the real-time manner of the present disclosure, the arrangement of the third coupling transistor TO3 and the fourth coupling transistor TO4 facilitates stabilizing the potential of the seventh node N7. That is, facilitates stabilizing the potential of the output terminal of the second input module 20. When the potential of the control terminal of the fourth output module 1912 changes, the third coupling transistor TO3 may reduce the influence of the change of the potential on the potential of the seventh node N7, thereby stabilizing the potential of the seventh node N7. When the potential of the control terminal of the sixth output module 1922 changes, the fourth coupling transistor TO4 may reduce the influence of the change of the potential on the potential of the seventh node N7, thereby stabilizing the potential of the seventh node N7, and further facilitating ensuring the accuracy of outputting the second trigger signal SN_IN by the second input module 20.

Still referring to FIG. 14, the first shift register unit 101 further includes a sixth capacitor C6 and a seventh capacitor C7, one plate of the sixth capacitor C6 is electrically connected to the control terminal of the fourth output module 1912, and another plate is electrically connected to the output terminal SP_OUT1 of the first scanning signal output module 191, so as to stabilize the potential of the control terminal of the fourth output module 1912. One plate of the seventh capacitor C7 is electrically connected to the output terminal SP_OUT2 of the second scanning signal output module 192, and another plate is electrically connected to the control terminal of the sixth output module 1922, so as to stabilize the potential of the control terminal of the sixth output module 1922.

It should be noted that, in the first shift register unit shown in FIGS. 13 and 14, the first cascade module 12 and the first-type signal output module 16 may also be arranged to be independent from each other, and the first shift register unit may include the first-type signal output module 16 and the gating module 17 shown in FIGS. 11 and 12.

Figure 16:
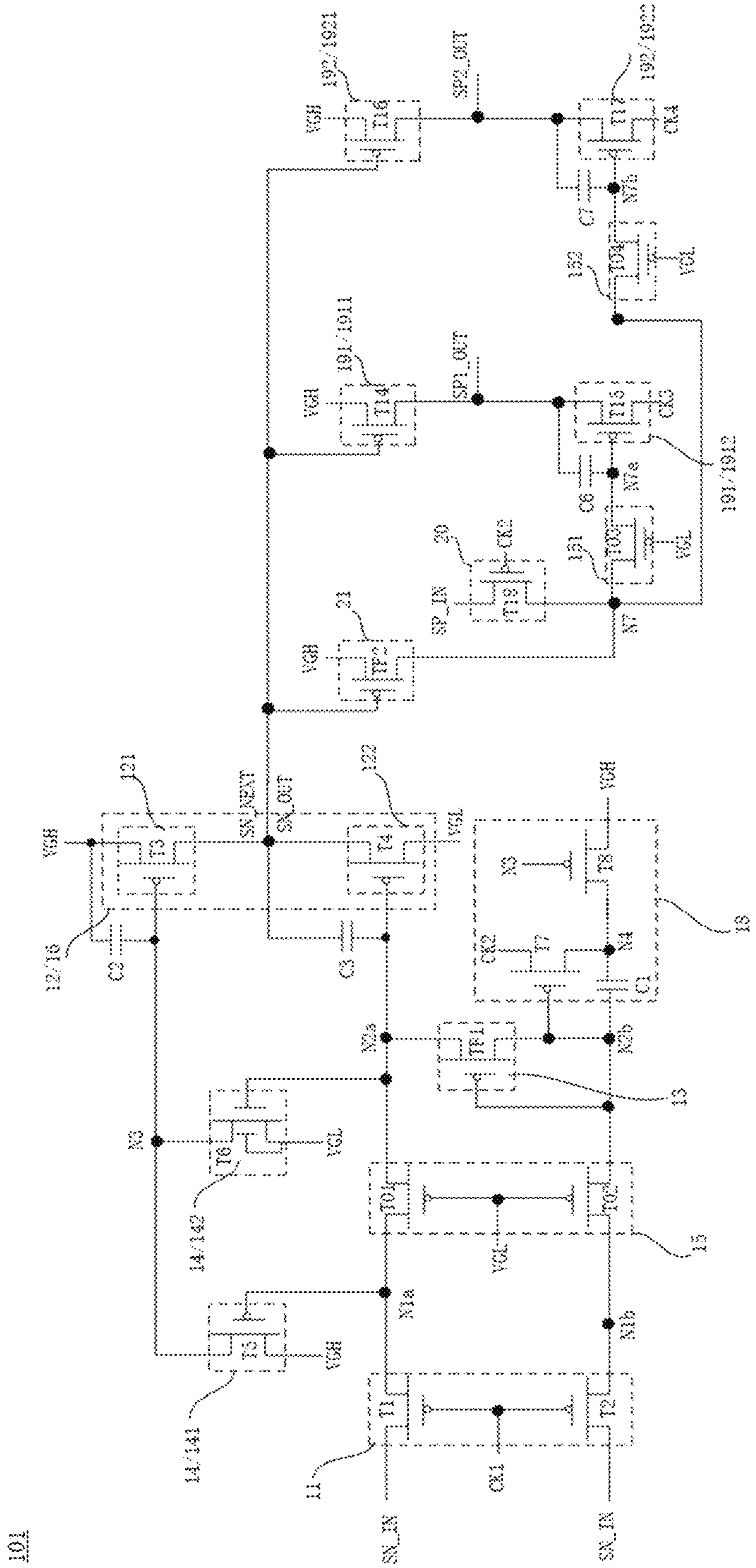
FIG. 16 is a schematic diagram of a first shift register unit according to an embodiment of the present disclosure.

FIG. 16 is a schematic diagram of a first shift register unit according to an embodiment of the present disclosure. A difference between the first shift register unit shown in FIG. 16 and the first shift register unit shown in FIG. 14 may be that the gate of the eighteenth transistor T18 receives a second clock signal CK2, the first electrode of a fifteenth transistor T15 receives the third clock signal CK3, and the first electrode of the seventeenth transistor T17 receives a fourth clock signal CK4.

As such, compared with the first shift register unit shown in FIG. 14, it is advantageous to reduce the load of the first clock signal CK1 and improve the difference of signal output caused by unbalanced clock signal load.

Figure 17:
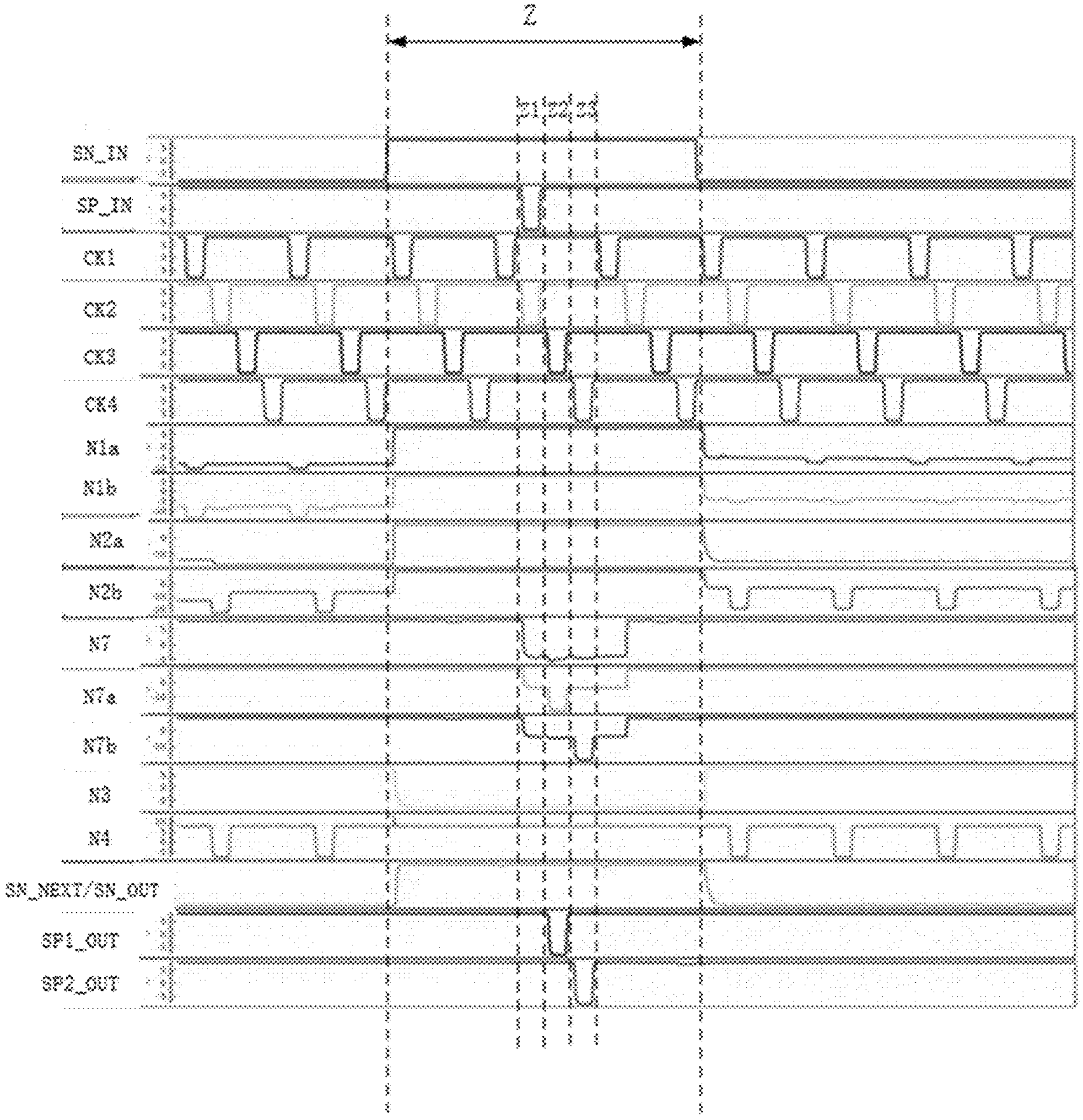
FIG. 17 is a timing diagram of the first shift register unit shown in FIG. 16.

FIG. 17 is a timing diagram of the first shift register unit shown in FIG. 16. With reference to FIG. 17, in the signal output period Z of the first shift register unit 101, the first trigger signal SN_IN is the high-level signal, the first primary node N1*a*, the first secondary node N1*b*, the second primary node N2*a* and the second secondary node N2*b* are all high-level signals, the third node N3 is the low-level signal, and the output terminal SN_NEXT (the output terminal SN_OUT of the first-type signal output module) of the first cascade module 12 outputs the high-level signal.

The signal output period Z of the first shift register unit 101 includes a first phase Z1, a second phase Z2 and a third phase Z3, in which all the first clock signals CK1 are the high-level signals.

In the first phase Z1, the second trigger signal SP_IN is the low-level signal, the second clock signal CK2 is the low-level signal, the seventh node N7 is the low-level signal, and both the third clock signal CK3 and the fourth clock signal CK4 are the high-level. The output terminal SP_OUT1 of the first scanning signal output module 191 and the output terminal SP_OUT2 of the second scanning signal output module 192 both output the high-level signals.

In the second phase Z2, the second trigger signal SP_IN is the high-level signal, the second clock signal CK2 and the fourth clock signal CK4 are the high-level signals, the seventh node N7 remains the low-level signal, and the third clock signal CK3 is the low-level signal. The output terminal SP_OUT1 of the first scanning signal output module 191 outputs the low-level signal, and the output terminal SP_OUT2 of the second scanning signal output module 192 outputs the high-level signal.

In the third phase Z3, the second trigger signal SP_IN is the high-level signal, the second clock signal CK2 and the third clock signal CK3 are the high-level signals, the seventh node N7 remains the low-level signal, and the fourth clock signal CK4 is the low-level signal. The output terminal SP_OUT1 of the first scanning signal output module 191 outputs the high-level signal, and the output terminal SP_OUT2 of the second scanning signal output module 192 outputs the low-level signal.

Figure 18:
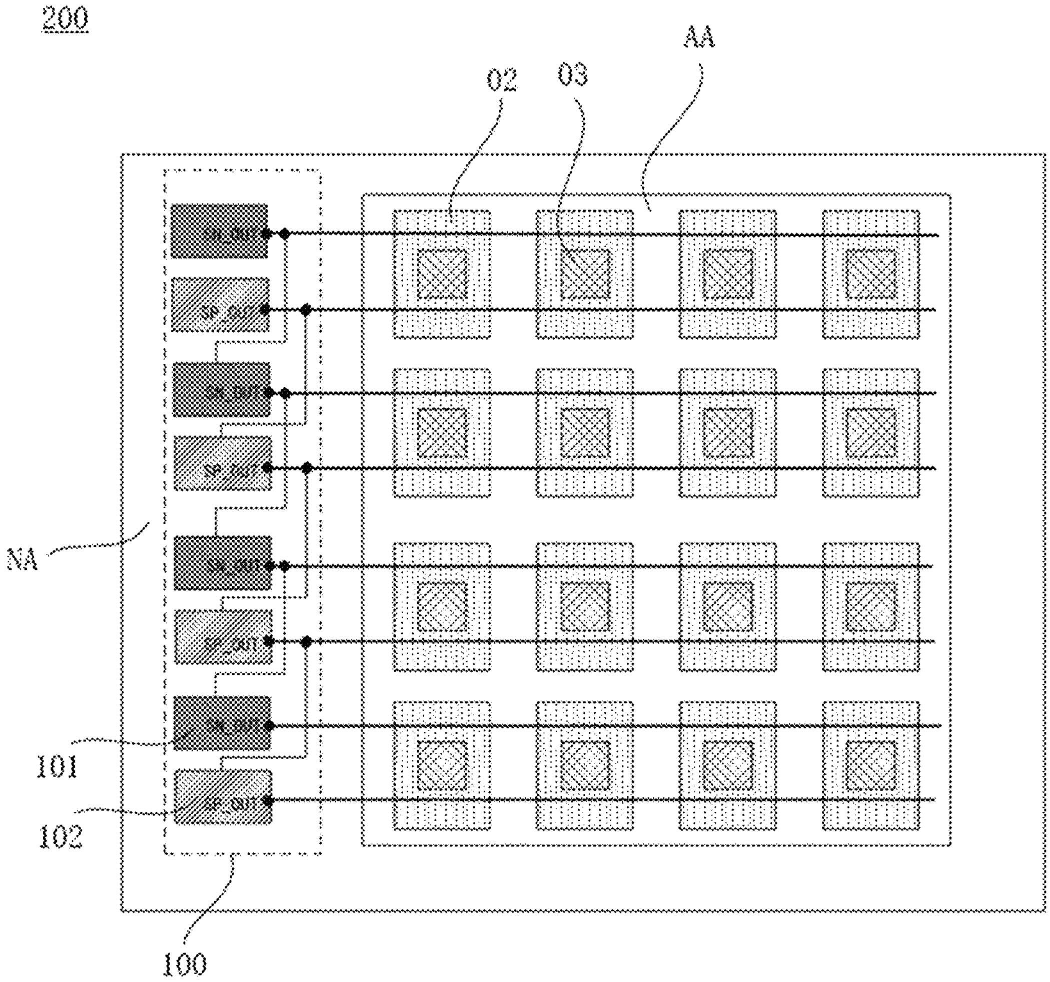
FIG. 18 is a plan schematic diagram of another display panel according to an embodiment of the present disclosure.
Figure 19:
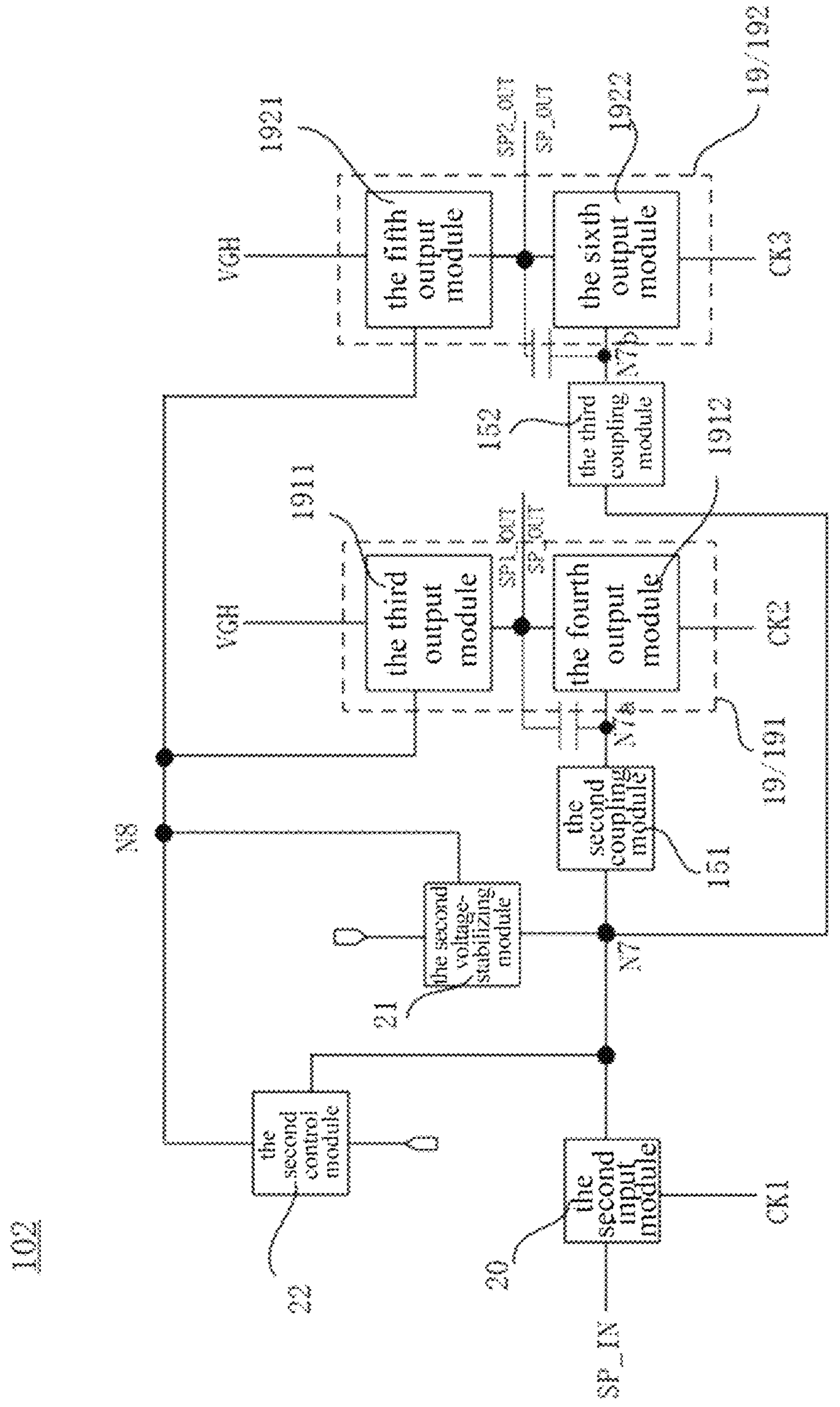
FIG. 19 is a simplified structural schematic diagram of a second shift register unit according to an embodiment of the present disclosure.

FIG. 18 is a schematic diagram of another display panel according to an embodiment of the present disclosure. FIG. 19 is a simplified structural diagram of a second shift register unit according to an embodiment of the present disclosure.

In an embodiment of the present disclosure, as shown in FIG. 18, the scanning circuit 100 further includes a plurality of cascaded second shift register units 102, and the second shift register unit 102 and the first shift register unit 101 may respectively provide scanning signals to different transistors in the pixel circuit.

Exemplarily, the first shift register unit 101 is configured to provide the gate scanning signal to the gate reset transistor and/or a threshold capturing transistor in the pixel circuit. The second shift register unit 102 is configured to provide the gate scanning signal to the data writing transistor in the pixel circuit.

As shown in FIG. 19, the second shift register unit 102 includes the second-type signal output module 19 and the second input module 20, the output terminal SP_OUT of the second-type signal output module 19 is configured to output the second-type scanning signal, the second-type scanning signal may be the gate scanning signal received by the data writing transistor in the pixel circuit, and the enable signal output by the output terminal SP_OUT of the second-type signal output module 19 may be the low-level signal.

The second input module 20 is configured to receive the second trigger signal SP_IN, the output terminal of the second input module 20 is electrically connected to the seventh node N7, and the seventh node N7 is coupled to some control terminals of the second-type signal output module 19.

In an embodiment, the second shift register unit 102 further includes the second voltage-stabilizing switch module 21, and the output terminal of the second voltage-stabilizing switch module 21 is electrically connected to the seventh node N7.

In an implementation, the second shift register unit 102 and the first shift register unit 101 may be independent of each other, which is beneficial to improving the flexibility of the operation timing of the second shift register unit 102 and the first shift register unit 101. In addition, the output terminal of the second voltage-stabilizing switch module 21 is electrically connected to the seventh node N7, which is also beneficial to improving the stability of the potential of the seventh node N7 and reducing the probability of abnormal output of the second-type signal output module 19.

In an embodiment, as shown in FIG. 19, the control terminal of the second input module 20 receives the first clock signal CK1, the second-type signal output module 10 includes the first scanning signal output module 191 and the second scanning signal output module 192, and the first scanning signal output module 191 and the second scanning signal output module 192 may be electrically connected to the gates of the data writing transistors M2 of pixel circuits 02 of different rows, respectively.

Exemplarily, the first scanning signal output module 191 and the second scanning signal output module 192 are electrically connected to the gates of the data writing transistors M2 of pixel circuits 02 of two adjacent rows. The second shift register unit 102 may drive pixel circuits of two adjacent rows.

The first scanning signal output module 191 includes a third output module 1911 and a fourth output module 1912, the input terminal of the third output module 1911 receives the first fixed potential signal VGH, the output terminal of the third output module 1911 is electrically connected to the output terminal SP_OUT1 of the first scanning signal output module 191, and the control terminal of the third output module 1911 is electrically connected to the eighth node N8. The input terminal of the fourth output module 1912 receives the second clock signal CK2, the output terminal of the fourth output module 1912 is electrically connected to the output terminal SP_OUT1 of the first scanning signal output module 191, and the control terminal of the fourth output module 1912 is coupled to the seventh node N7. Exemplarily, the control terminal of the fourth output module 1912 is electrically connected to the seventh secondary node I N7*a*, and the second coupling module 151 is arranged between the seventh node N7 and the seventh secondary node I N7*a*.

The second scanning signal output module 192 includes a fifth output module 1921 and a sixth output module 1922, the input terminal of the fifth output module 1921 receives the first fixed potential signal VGH, the output terminal of the fifth output module 1921 is electrically connected to the output terminal SP_OUT2 of the second scanning signal output module 192, and the control terminal of the fifth output module 1921 is electrically connected to the eighth node N8. The input terminal of the sixth output module 1922 receives a third clock signal CK3, the output terminal of the sixth output module 1922 is electrically connected to the output terminal SP_OUT2 of the second scanning signal output module 192 and the control terminal of the sixth output module 1922 is coupled to the seventh node N7. Exemplarily, the control terminal of the sixth output module 1922 is electrically connected to the seventh secondary node II N7*b*, and the third coupling module 152 is arranged between the seventh node N7 and the seventh secondary node II N7*b*.

It should be noted that both the output terminal SP1_OUT of the first scanning signal output module 191 and the output terminal SP2_OUT of the second scanning signal output module 192 may be the output terminal SP_OUT of the second-type signal output module 19. The signal output by the output terminal SP_OUT2 of the second scanning signal output module 192 in the previous stage of second shift register unit 102 may be the second trigger signal SP_IN received by the second input module 20 in the next stage of the second shift register unit 102.

The second shift register unit 102 further includes a second control module 22, and the output terminal of the second control module 22 is electrically connected to the eighth node N8 and the second voltage-stabilizing switch module 21.

In an embodiment, the first scanning signal output module 191 outputs the first fixed potential signal VGH or the second clock signal CK2 in response to the potential of the eighth node N8 and the potential of the seventh node N7, and the second scanning signal output module 192 outputs the first fixed potential signal VGH or the third clock signal CK3 in response to the potential of the eighth node N8 and the potential of the seventh node N7.

Figure 20:
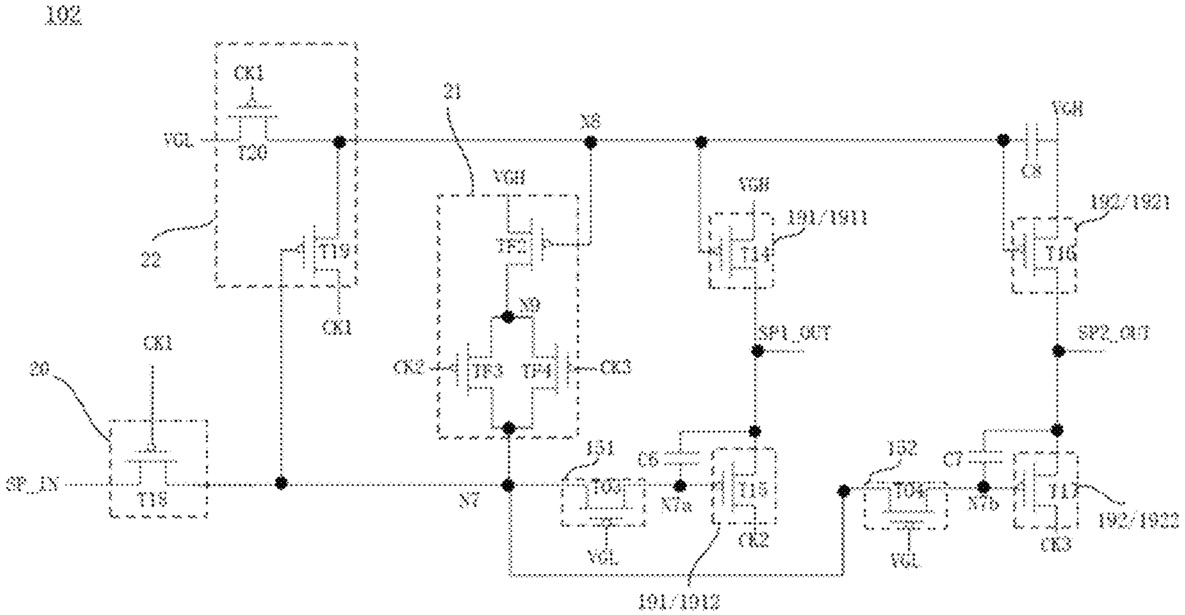
FIG. 20 is a schematic diagram of a second shift register unit according to an embodiment of the present disclosure.

FIG. 20 is a schematic diagram of a second shift register unit according to an embodiment of the present disclosure. Exemplarily, as shown in FIG. 20, which is, the third output module 1911 includes the fourteenth transistor T14, the first electrode of the fourteenth transistor T14 receives the first fixed potential signal VGH, the second electrode of the fourteenth transistor T14 is electrically connected to the output terminal SP_OUT1 of the first scanning signal output module 191, and the gate of the fourteenth transistor T14 is electrically connected to the eighth node N8.

The fourth output module 1912 includes a fifteenth transistor T15, the first electrode of the fifteenth transistor T15 receives the second clock signal CK2, the second electrode of the fifteenth transistor T15 is electrically connected to the output terminal SP_OUT1 of the first scanning signal output module 191, and the gate of the fifteenth transistor T15 is coupled to the seventh node N7.

The fifth output module 1921 includes a sixteenth transistor T16, the first electrode of the sixteenth transistor T16 receives the first fixed potential signal VGH, the second electrode of the sixteenth transistor T16 is electrically connected to the output terminal SP_OUT2 of the second scanning signal output module 192, and the gate electrode of the sixteenth transistor T16 is electrically connected to the eighth node N8.

The sixth output module 1922 includes a seventeenth transistor T17, the first electrode of the seventeenth transistor T17 receives the third clock signal CK3, the second electrode of the seventeenth transistor T17 is electrically connected to the output terminal SP_OUT2 of the second scanning signal output module 192, and the gate of the seventeenth transistor T17 is coupled to the seventh node N7.

The second input module 20 comprises an eighteenth transistor T18, the first electrode of the eighteenth transistor T18 receives the second trigger signal SP_IN, the second electrode of the eighteenth transistor T18 is electrically connected to the seventh node N7, and the gate of the eighteenth transistor T18 receives the first clock signal CK1;

In an embodiment, the fourteenth transistor T14, the fifteenth transistor T15, the sixteenth transistor T16, the seventeenth transistor T17. The eighteenth transistor T18 have the same channel type.

Exemplarily, the fourteenth transistor T14, the fifteenth transistor T15, the sixteenth transistor T16, the seventeenth transistor T17, and the eighteenth transistor T18 are all P-type transistors.

In addition, as shown in FIG. 20, the gate of the fifteenth transistor T15 is electrically connected to the seventh secondary node I N7*a*, and the third coupling transistor TO3 is arranged between the seventh node N7 and the seventh secondary node I N7*a*, that is, the third coupling transistor TO3 is arranged between the seventh node N7 and the gate of the fifteenth transistor T15. The gate of the seventeenth transistor T17 is electrically connected to the seventh secondary node II N7*b*, and the fourth coupling transistor TO4 is arranged between the seventh node N7 and the seventh secondary node II N7*b*, that is, the fourth coupling transistor TO4 is arranged between the seventh node N7 and the gate of the seventeenth transistor T17. The gate of the third coupling transistor TO3 and the gate of the fourth coupling transistor TO4 both receive the second fixed potential signal VGL.

In an embodiment, the third coupling transistor TO3 and the fourth coupling transistor TO4 have the same channel type. During operation process of the second shift register unit 102, the third coupling transistor TO3 and the fourth coupling transistor TO4 may remain in the on state.

Exemplarily, both the third coupling transistor TO3 and the fourth coupling transistor TO4 are P-type transistors.

The arrangement of the third coupling transistor TO3 and the fourth coupling transistor TO4 may reduce the influence of the change of the potential of the seventh secondary node I N7*a* and the seventh secondary node II N7*b* on the seventh node N7, which is beneficial to improving the stability of the potential of the seventh node N7.

Further, as shown in FIG. 20, the second shift register unit 102 further includes a sixth capacitor C6, a seventh capacitor C7 and an eighth capacitor C8, one plate of the sixth capacitor C6 is electrically connected to the gate of the fifteenth transistor T15, and another plate of the sixth capacitor C6 is electrically connected to the output terminal SP_OUT1 of the first scanning signal output module 191 to stabilize the potential of the gate of the fifteenth transistor T15.

One plate of the seventh capacitor C7 is electrically connected to the output terminal SP_OUT2 of the second scanning signal output module 192, and another plate is electrically connected to the gate of the seventeenth transistor T17, so as to stabilize the potential of the gate of the seventeenth transistor T17.

One plate of the eighth capacitor C8 receives the first fixed potential signal VGH, another plate is electrically connected to the eighth node N8, so as to stabilize the potential of the eighth node N8 and improve the stability of the potential of the gates of the fourteenth transistor T14 and the sixteenth transistor T16.

In an implementation, as shown in FIG. 20, the second control module 22 includes a nineteenth transistor T19 and a twentieth transistor T20, the first electrode of the nineteenth transistor T19 receives the first clock signal CK1, the second electrode of the nineteenth transistor T19 is electrically connected to the eighth node N8, the gate of the nineteenth transistor T19 is electrically connected to the seventh node N7, the first electrode of the twentieth transistor T20 receives the second fixed potential signal VGL, the second electrode of the twentieth transistor T20 is electrically connected to the eighth node N8, and the gate of the twentieth transistor T20 receives the first clock signal. The second control module 22 may transmit the second fixed potential signal VGL or the first clock signal CK1 to the eighth node N8 in response to the potential of the seventh node N7 and the first clock signal CK1.

The second voltage-stabilizing switch module 21 includes a second voltage-stabilizing transistor TF2, a third voltage-stabilizing transistor TF3, and a fourth voltage-stabilizing transistor TF4, the first electrode of the second voltage-stabilizing transistor TF2 receives the first fixed potential signal VGH, the second electrode is electrically connected to the ninth node N9, and the gate is electrically connected to the eighth node N8, the first electrode of the third voltage-stabilizing transistor TF3 is electrically connected to the ninth node N9, the second electrode is electrically connected to the seventh node N7, and the gate receives the second clock signal CK2, the first electrode of the fourth voltage-stabilizing transistor TF4 is electrically connected to the ninth node N9, the second electrode is electrically connected to the seventh node N7, and the gate receives the third clock signal CK3.

The second voltage-stabilizing switch module 21 may transmit the first fixed potential signal VGH to the seventh node N7 in response to the potential of the eighth node N8, the second clock signal CK2, and the third clock signal CK3.

In an embodiment, the nineteenth transistor 19, the twentieth transistor 20, the second voltage-stabilizing transistor TF2, the third voltage-stabilizing transistor TF3 and the fourth voltage-stabilizing transistor TF4 have the same channel type.

Exemplarily, the nineteenth transistor T19, the twentieth transistor T20, the second voltage-stabilizing transistor TF2, the third voltage-stabilizing transistor TF3 and the fourth voltage-stabilizing transistor TF4 are all P-type transistors.

In an implementation, in the period in which the seventh node N7 remains the high-level, the twentieth transistor T20 may transmit the low-level second fixed potential signal VGL to the eighth node N8, the low-level signal of the eighth node N8 controls the second voltage-stabilizing transistor TF2 to be turned on, the high-level first fixed potential signal VGH may be transmitted to the ninth node N9 through the second voltage-stabilizing transistor TF2, and when the second clock signal CK2 transmits the low-level signal, the high-level of the ninth node N9 may be transmitted to the seventh node N7 through the third voltage-stabilizing transistor T3 to remain the high-level potential of the seventh node N7 and the seventh secondary node I N7*a*, which is beneficial to avoiding the case that the fifteenth transistor T15 is turned on for multiple times because the second clock signal CK2 jumps to pull down the potential of the seventh secondary node I N7*a*. When the third clock signal CK3 transmits the low-level signal, the high-level of the ninth node N9 may be transmitted to the seventh node N7 through the fourth voltage-stabilizing transistor TF4, and the potential of the high-level of the seventh node N7 and the seventh secondary node II N7*b* is maintained, which is beneficial to avoiding the case that the seventeenth transistor T17 is turned on for multiple times because the third clock signal CK3 jumps to pull down the potential of the seventh secondary node II N7*b*.

Figure 21:
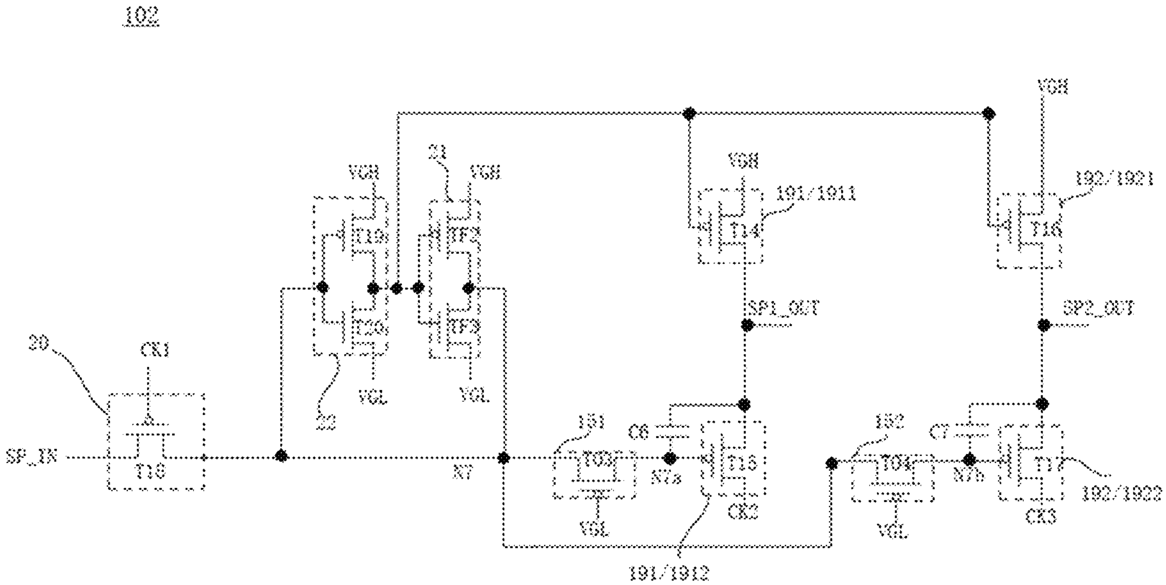
FIG. 21 is a schematic diagram of another second shift register unit according to an embodiment of the present disclosure.

FIG. 21 is a schematic diagram of another second shift register unit according to an embodiment of the present disclosure. In another implementation, as shown in FIG. 21, the second control module 22 includes the nineteenth transistor T19 and the twentieth transistor T20 having different channel types, the first electrode of the nineteenth transistor T19 receives the first fixed potential signal VGH, the second electrode of the nineteenth transistor T19 is electrically connected to the eighth node N8, and the gate of the nineteenth transistor T19 is electrically connected to the seventh node N7, and the first electrode of the twentieth transistor T20 receives the second fixed potential signal VGL, the second electrode of the twentieth transistor T20 is electrically connected to the eighth node N8, and the gate of the twentieth transistor T20 is electrically connected to the seventh node N7. The second control module 22 transmits the first fixed potential signal VGH or the second fixed potential signal VGL to the eighth node N8 in response to the potential of the seventh node N7, and the potential level of the eighth node N8 may be opposite to the potential level of the seventh node N7.

The second voltage-stabilizing switch module 21 includes the second voltage-stabilizing transistor TF2 and the third voltage-stabilizing transistor TF3 having different channel types, the first electrode of the second voltage-stabilizing transistor TF2 receives the first fixed potential signal VGH, the second electrode of the second voltage-stabilizing transistor TF2 is electrically connected to the seventh node N7, the gate of the second voltage-stabilizing transistor TF2 is electrically connected to the eighth node N8, the first electrode of the third voltage-stabilizing transistor TF3 receives the second fixed potential signal VGL, the second electrode of the third voltage-stabilizing transistor TF3 is electrically connected to the seventh node N7, and the gate of the third voltage-stabilizing transistor TF3 is electrically connected to the eighth node N8. The second voltage-stabilizing switch module 21 transmits the first fixed potential signal VGH or the second fixed potential signal VGL to the seventh node N7 in response to the potential of the eighth node N8.

In an embodiment, the nineteenth transistor T19 and the second voltage-stabilizing transistor TF2 have the same channel type, and the twentieth transistor T20 and the third voltage-stabilizing transistor TF3 have the same channel type.

Exemplarily, the nineteenth transistor T19 and the second voltage-stabilizing transistor TF2 are P-type transistors, and the twentieth transistor T20 and the third voltage-stabilizing transistor TF3 are N-type transistors.

In an implementation, in a period in which the seventh node N7 remains the high-level, the nineteenth transistor T19 is turned off, the twentieth transistor T20 is turned on, the low-level second fixed potential signal VGL is transmitted to the eighth node N8 through the twentieth transistor T20, the eighth node N8 remains the low-level, the low-level potential of the eighth node N8 controls the second voltage-stabilizing transistor TF2 to be turned on, the third voltage-stabilizing transistor TF3 is turned off, the high-level first fixed potential signal VGH is transmitted to the seventh node N7 through the second voltage-stabilizing transistor TF2, and the high-level potentials of the seventh node N7, the seventh secondary node I N7*a*, and the seventh secondary node II N7*b* are remained. It is advantageous to avoid the case that the fifteenth transistor T15 is turned on for multiple times because the second clock signal CK2 jumps to pull down the seventh secondary node I N7*a*, and avoid the case that the seventeenth transistor T17 is turned on for multiple times because the third clock signal CK3 jumps to pull down the seventh secondary node II N7*b*.

During the period in which the seventh node N7 remains the low-level, the nineteenth transistor T19 is turned on, the twentieth transistor T20 is turned off, the high-level first fixed potential signal VGH is transmitted to the eighth node N8 through the nineteenth transistor T19, the eighth node N8 remains the high-level, the high-level potential of the eighth node N8 controls the second voltage-stabilizing transistor TF2 to be turned off, the third voltage-stabilizing transistor TF3 is turned on, the low-level second fixed potential signal VGL s transmitted to the seventh node N7 through the third voltage-stabilizing transistor TF3, and the low-level potential of the seventh node N7, the seventh secondary node I N7*a* and the seventh secondary node II N7*b* is remained.

In an implementation, the seventh node N7 may maintain a stable high-level potential or low-level potential, and the potential of the seventh node N7 does not float, which is beneficial to improving the potential stability of the seventh node N7.

Figure 22:
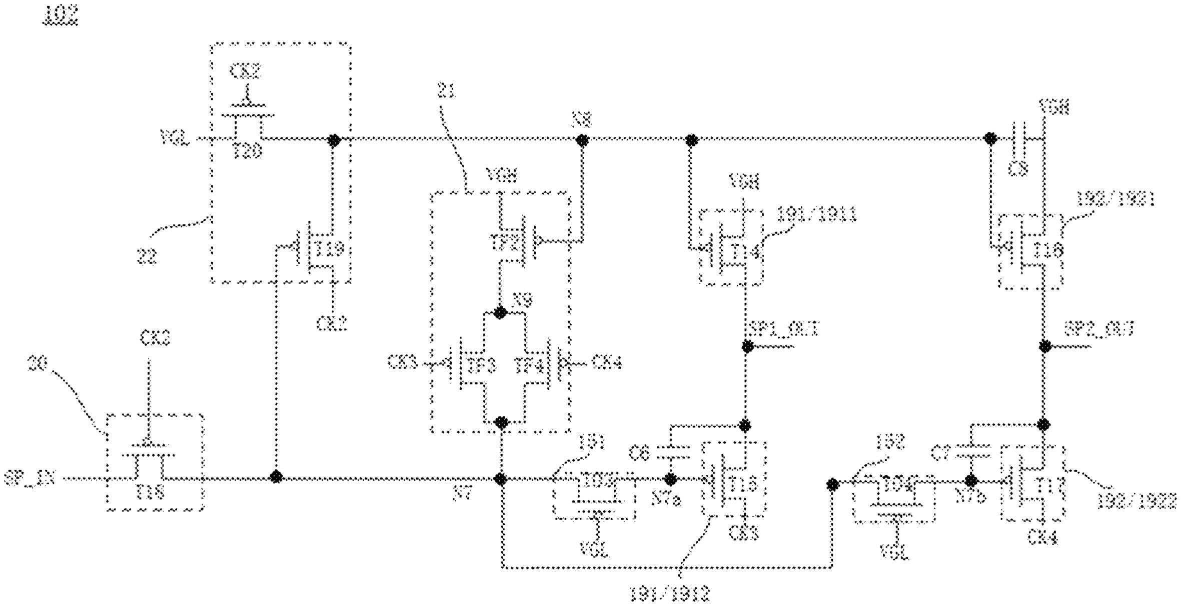
FIG. 22 is a schematic diagram of another second shift register unit according to an embodiment of the present disclosure.

FIG. 22 is a schematic diagram of another second shift register unit according to an embodiment of this disclosure. The difference between the second shift register unit shown in FIG. 22 and the second shift register unit shown in FIG. 20 may be in that the gate electrode of the eighteenth transistor T18, the first electrode of the nineteenth transistor T19, and the gate of the twentieth transistor T20 all receive the second clock signal CK2, the first electrode of the fifteenth transistor T15, and the gate of the third voltage-stabilizing transistor TF3 all receive the third clock signal CK3, and the first electrode of the seventeenth transistor T17 and the gate of the fourth voltage-stabilizing transistor TF4 all receive the fourth clock signal CK4.

As such, in the scanning circuit 100 composed of the second shift register unit shown in FIG. 22 and the first shift register unit 101 shown in any one of FIG. 6, FIG. 8, FIG. 10, and FIG. 12, the load of the first clock signal CK1 may be reduced, which is beneficial to reducing the signal output difference caused by unbalanced clock signal load.

Figure 23:
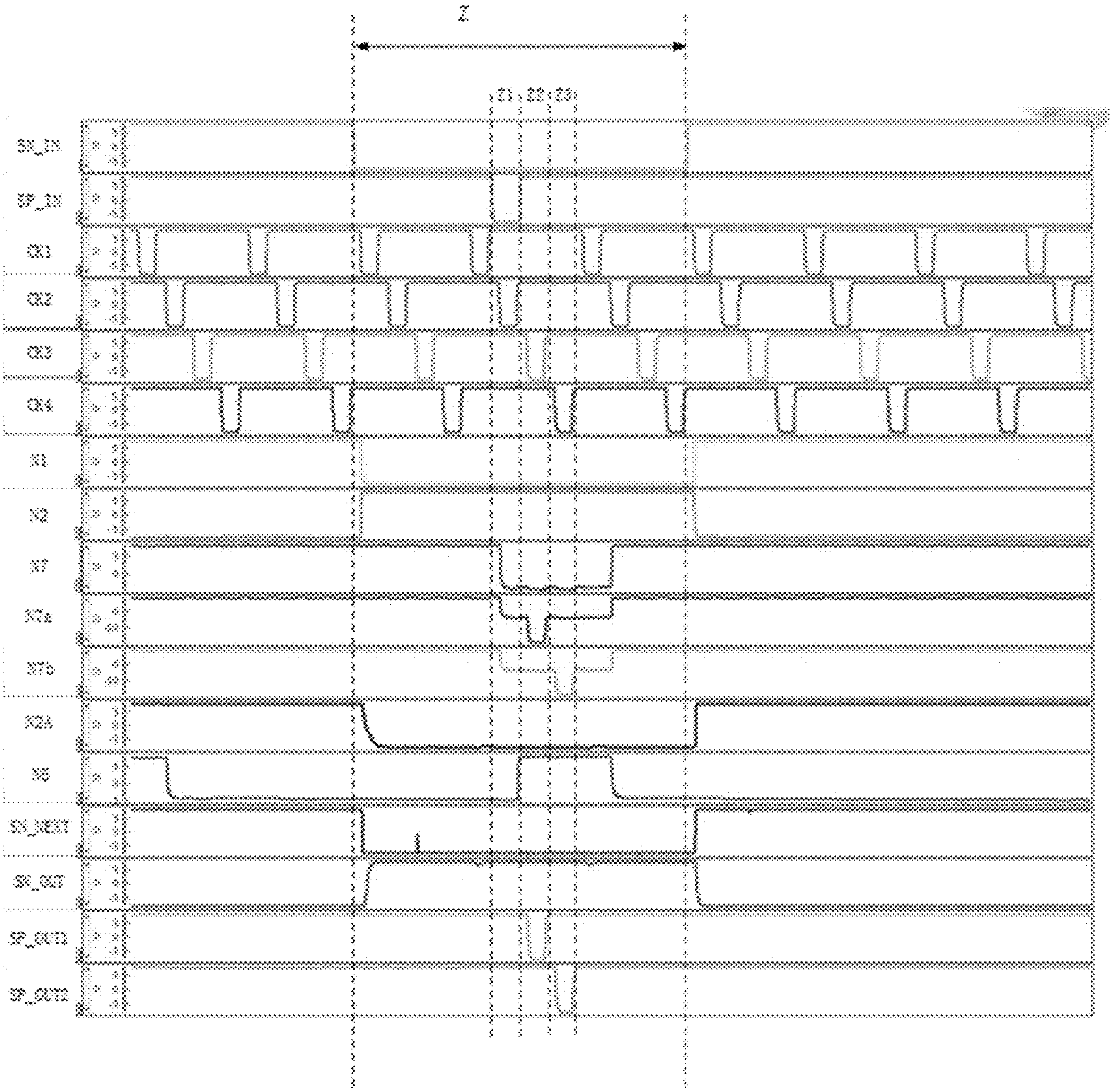
FIG. 23 is a timing diagram of a scanning circuit according to an embodiment of the present disclosure.

FIG. 23 is a timing diagram of a scanning circuit according to an embodiment of this disclosure, and the timing diagram shown in FIG. 23 is a timing diagram of a scanning circuit 100 including the first shift register unit 101 shown in FIG. 8 and the second shift register unit 102 shown in FIG. 22.

As shown in FIG. 23, in the signal output period Z of the scanning circuit 100, the first trigger signal SN_IN is the low-level signal, the first node N1 is the low-level signal, the second node N2 is the high-level signal, the second sub-node N2A is the low-level signal, the first cascade signal output by the output terminal SN_NEXT of the first cascade module 12 is the low-level signal, and the first-type scanning signal output by the output terminal SN_OUT of the first-type signal output module 16 is the high-level signal.

The signal output period Z of the first scanning circuit 100 further includes a first phase Z1, a second phase Z2 and a third phase Z3, in which all the first clock signals CK1 are the high-level signals.

In the first phase Z1, the second trigger signal SP_IN is the low-level signal, the second clock signal CK2 is the low-level signal, the seventh node N7 is the low-level signal, the eighth node N8 is the low-level signal, and both the third clock signal CK3 and the fourth clock signal CK4 are the high-level. The output terminal SP_OUT1 of the first scanning signal output module 191 and the output terminal SP_OUT2 of the second scanning signal output module 192 both output the high-level signals.

In the second phase Z2, the second trigger signal SP_IN is the high-level signal, the second clock signal CK2 and the fourth clock signal CK4 are the high-level signals, the seventh node N7 remains the low-level signal, the eighth node N8 is the high-level signal, and the third clock signal CK3 is the low-level signal. The output terminal SP_OUT1 of the first scanning signal output module 191 outputs the low-level signal, and the output terminal SP_OUT2 of the second scanning signal output module 192 outputs the high-level signal.

In the third phase Z3, the second trigger signal SP_IN is the high-level signal, the second clock signal CK2 and the third clock signal CK3 are the high-level signals, the seventh node N7 remains the low-level signal, the eighth node N8 remains the high-level signal, and the fourth clock signal CK4 is the low-level signal. The output terminal SP_OUT1 of the first scanning signal output module 191 outputs the high-level signal, and the output terminal SP_OUT2 of the second scanning signal output module 192 outputs the low-level signal.

It should be noted that, in the timing diagram shown in FIG. 23, the gating signal line CTRL transmits the low-level signal.

Figure 24:
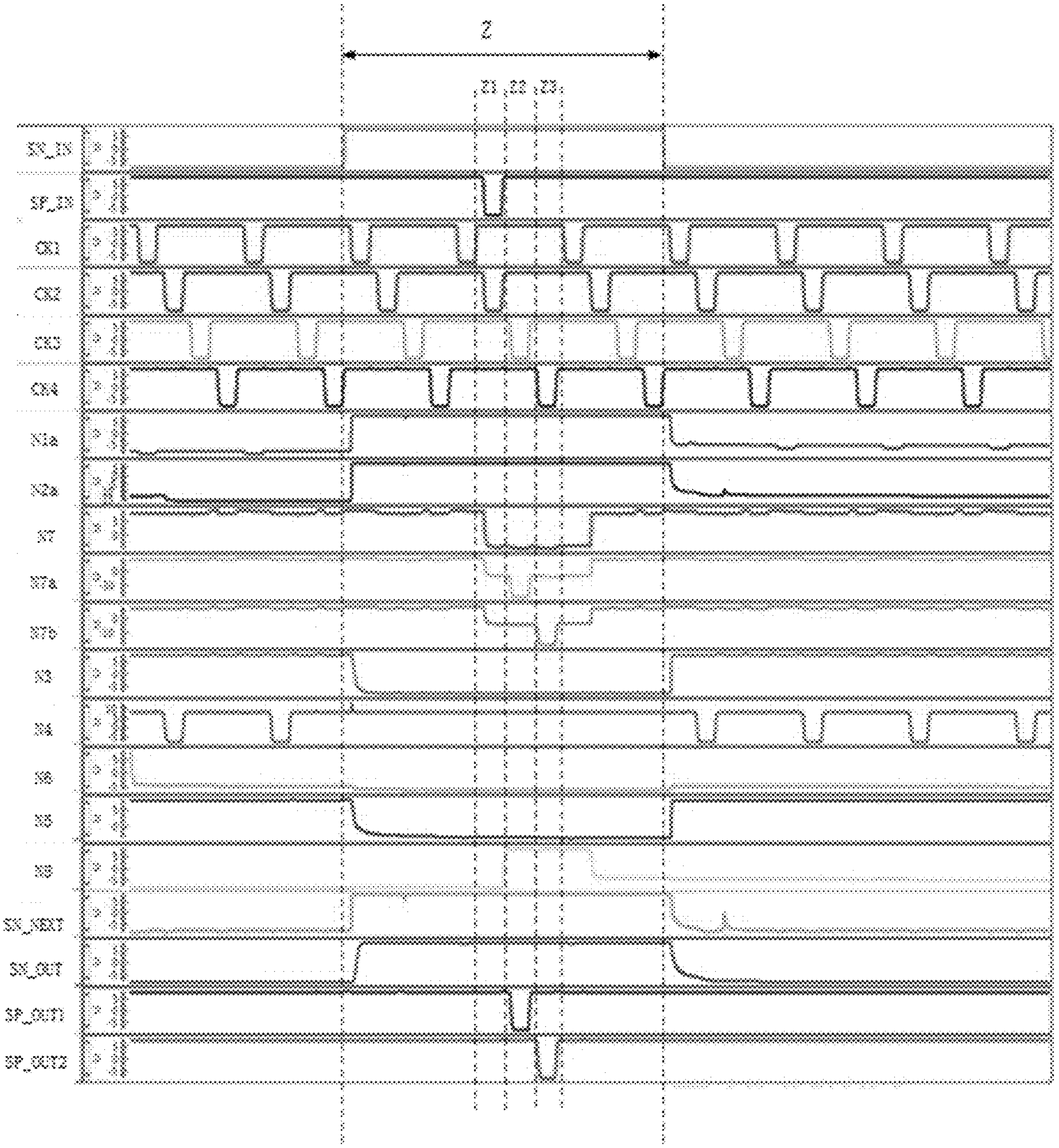
FIG. 24 is a timing diagram of another scanning circuit according to an embodiment of the present disclosure.

FIG. 24 is a timing diagram of another scanning circuit according to an embodiment of this disclosure, and the timing diagram shown in FIG. 24 is a timing diagram of a scanning circuit 100 including the first shift register unit 101 shown in FIG. 12 and the second shift register unit 102 shown in FIG. 22.

As shown in FIG. 24, in the signal output period Z of the scanning circuit 100, the first trigger signal SN_IN is the high-level signal, both the first primary node N1*a* and the second primary node N2*a* are the high-level signals, the third node N3 is the low-level signal, the first cascade signal output by the output terminal SN_NEXT of the first cascade module 12 is the high-level signal, the sixth node N6 is the low-level signal, and the first-type scanning signal output by the output terminal SN_OUT of the first-type signal output module 16 is the high-level signal.

The signal output period Z of the first scanning circuit 100 further includes a first phase Z1, a second phase Z2 and a third phase Z3. In the first phase Z1, the second phase Z2 and the third phase Z3, all the first clock signals CK1 are the high-level signals.

In the first phase Z1, the second trigger signal SP_IN is the low-level signal, the second clock signal CK2 is the low-level signal, the seventh node N7 is the low-level signal, the eighth node N8 is the low-level signal, and both the third clock signal CK3 and the fourth clock signal CK4 are the high-level. The output terminal SP_OUT1 of the first scanning signal output module 191 and the output terminal SP_OUT2 of the second scanning signal output module 192 both output the high-level signals.

In the second phase Z2, the second trigger signal SP_IN is the high-level signal, the second clock signal CK2 and the fourth clock signal CK4 are the high-level signals, the seventh node N7 remains the low-level signal, the eighth node N8 is the high-level signal, and the third clock signal CK3 is the low-level signal. The output terminal SP_OUT1 of the first scanning signal output module 191 outputs the low-level signal, and the output terminal SP_OUT2 of the second scanning signal output module 192 outputs the high-level signal.

In the third phase Z3, the second trigger signal SP_IN is the high-level signal, the second clock signal CK2 and the third clock signal CK3 are the high-level signals, the seventh node N7 remains the low-level signal, the eighth node N8 remains the high-level signal, and the fourth clock signal CK4 is the low-level signal. The output terminal SP_OUT1 of the first scanning signal output module 191 outputs the high-level signal, and the output terminal SP_OUT2 of the second scanning signal output module 192 outputs the low-level signal.

Figure 25:
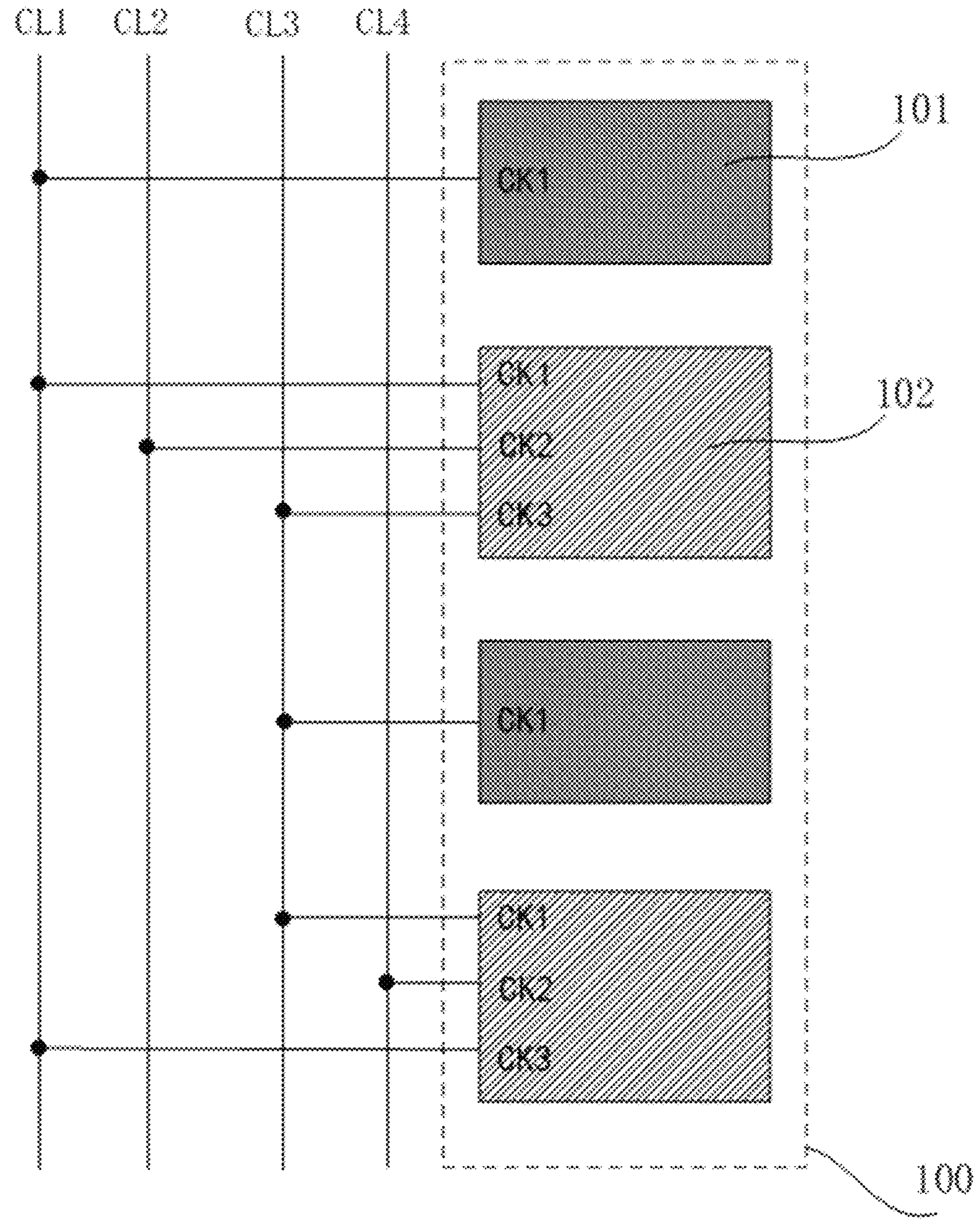
FIG. 25 is a connection schematic diagram of a scanning circuit according to an embodiment of the present disclosure.

FIG. 25 is a connection schematic diagram of a scanning circuit according to an embodiment of the present disclosure.

In an embodiment of the present disclosure, as shown in FIG. 8, FIG. 20, and FIG. 25, in the first shift register unit 101 of odd stages, the control terminal of the first input module 11 is electrically connected to the first clock signal line CL1, in the first shift register unit 101 of even stages, the control terminal of the first input module 11 is electrically connected to the third clock signal line CL3. That is, in the first shift register unit 101 of odd stages, the clock signal transmitted by the first clock signal line CL1 serves as the first clock signal CK1 received by the control terminal of the first input module 11, in the first shift register unit 101 of even stages, the clock signal transmitted by the third clock signal line CL3 serves as the first clock signal CK1 received by the control terminal of the first input module 11.

In the second shift register unit 102 of odd stages, the control terminal of the second input module 20 is electrically connected to the first clock signal line CL1, the input terminal of the fourth output module 1912 is electrically connected to the second clock signal line CL2, and the input terminal of the sixth output module 1922 is electrically connected to the third clock signal line CL3.

In the second shift register unit 102 of even stages, the control terminal of the second input module 20 is electrically connected to the third clock signal line CL3, the input terminal of the fourth output module 1912 is electrically connected to the fourth clock signal line CL4, and the input terminal of the sixth output module 1922 is electrically connected to the first clock signal line CL1.

That is, in the second shift register unit 102 of odd stages, the clock signal transmitted by the first clock signal line CL1 serves as the first clock signal CK1 received by the second shift register unit 102, the clock signal transmitted by the second clock signal line CL2 serves as the second clock signal CK2 received by the second shift register unit 102, the clock signal transmitted by the third clock signal line CL3 serves as the third clock signal CK3 received by the second shift register unit 102.

In the second shift register unit 102 of even stages, the clock signal transmitted by the third clock signal line CL3 serves as the first clock signal CK1 received by the second shift register unit 102, the clock signal transmitted by the fourth clock signal line CL4 serves as the second clock signal CK2 received by the second shift register unit 102, the clock signal transmitted by the first clock signal line CL1 serves as the third clock signal CK3 received by the second shift register unit 102.

In an implementation, the first shift register unit 101 and the second shift register unit 102 may share a clock signal line, which is beneficial to reducing the number of clock signal lines required by the scanning circuit 100 and reducing power consumption.

Figure 26:
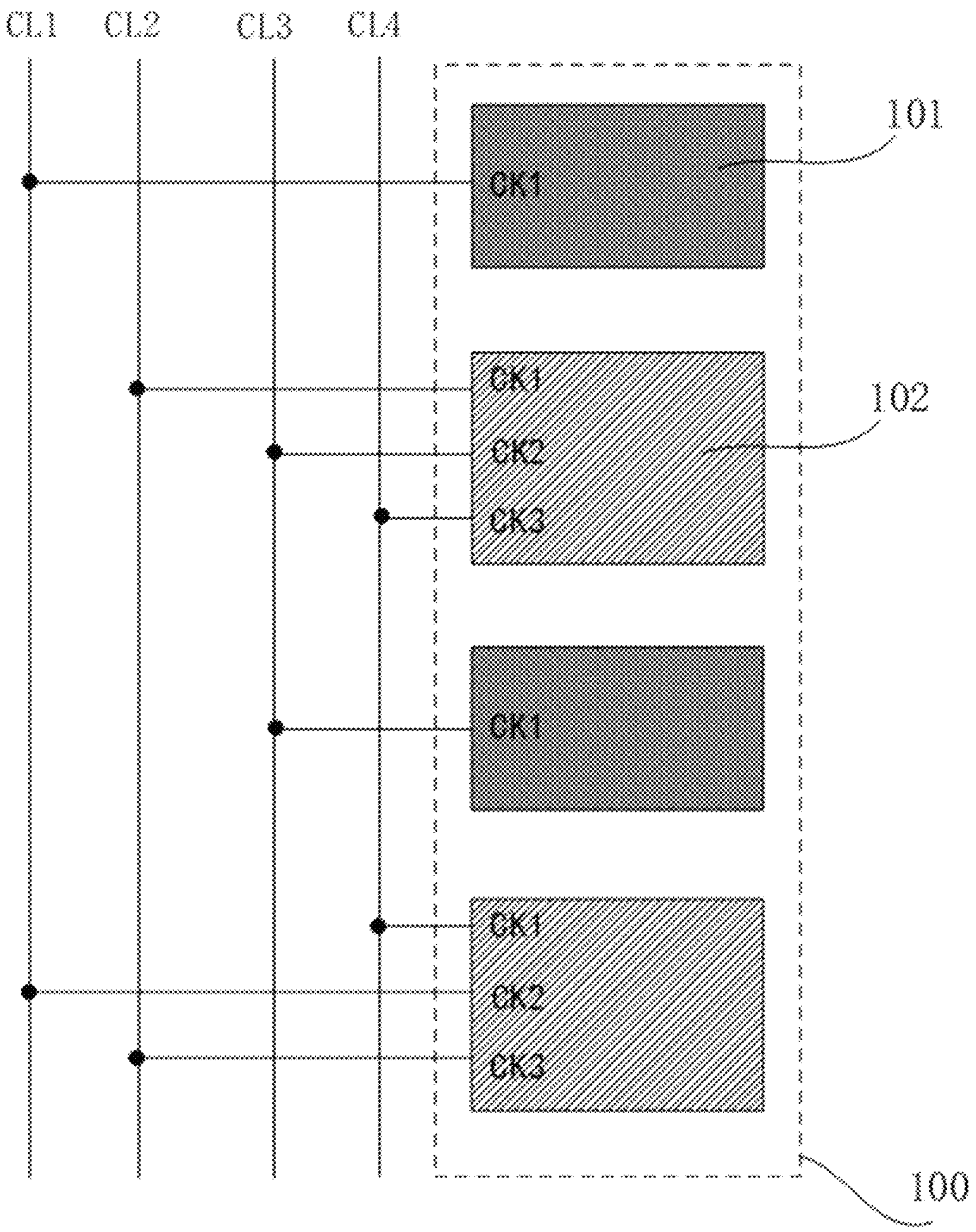
FIG. 26 is a connection schematic diagram of another scanning circuit according to an embodiment of the present disclosure.

FIG. 26 is a connection schematic diagram of another scanning circuit according to an embodiment of the present disclosure.

In an embodiment of the present disclosure, as shown in FIG. 8, FIG. 20, and FIG. 26, in the first shift register unit 101 of odd stages, the control terminal of the first input module 11 is electrically connected to the first clock signal line CL1, in the first shift register unit 101 of even stages, the control terminal of the first input module 11 is electrically connected to the third clock signal line CL3. That is, in the first shift register unit 101 of odd stages, the clock signal transmitted by the first clock signal line CL1 serves as the first clock signal CK1 received by the control terminal of the first input module 11, in the first shift register unit 101 of even stages, the clock signal transmitted by the third clock signal line CL3 serves as the first clock signal CK1 received by the control terminal of the first input module 11.

In the second shift register unit 102 of odd stages, the control terminal of the second input module 20 is electrically connected to the second clock signal line CL2, the input terminal of the fourth output module 1912 is electrically connected to the third clock signal line CL3, and the input terminal of the sixth output module 1922 is electrically connected to the fourth clock signal line CL4.

In the second shift register unit 102 of even stages, the control terminal of the second input module 20 is electrically connected to the fourth clock signal line CL4, the input terminal of the fourth output module 1912 is electrically connected to the first clock signal line CL1, and the input terminal of the sixth output module 1922 is electrically connected to the second clock signal line CL2.

That is, in the second shift register unit 102 of odd stages, the clock signal transmitted by the second clock signal line CL2 serves as the second clock signal CK2 received by the second shift register unit 102, the clock signal transmitted by the third clock signal line CL3 serves as the third clock signal CK2 received by the second shift register unit 102, the clock signal transmitted by the fourth clock signal line CL4 serves as the fourth clock signal CK4 received by the second shift register unit 102.

In the second shift register unit 102 of even stages, the clock signal transmitted by the fourth clock signal line CL4 serves as the second clock signal CK2 received by the second shift register unit 102, the clock signal transmitted by the first clock signal line CL1 serves as the third clock signal CK3 received by the second shift register unit 102, the clock signal transmitted by the second clock signal line CL2 serves as the fourth clock signal CK3 received by the second shift register unit 102.

In an implementation, the first shift register unit 101 and the second shift register unit 102 can share the clock signal line, facilitating balancing loads of clock signals transmitted by different clock signal lines and alleviating signal output differences of the shift register units caused by unbalanced loads of the clock signal lines.

Figure 27:
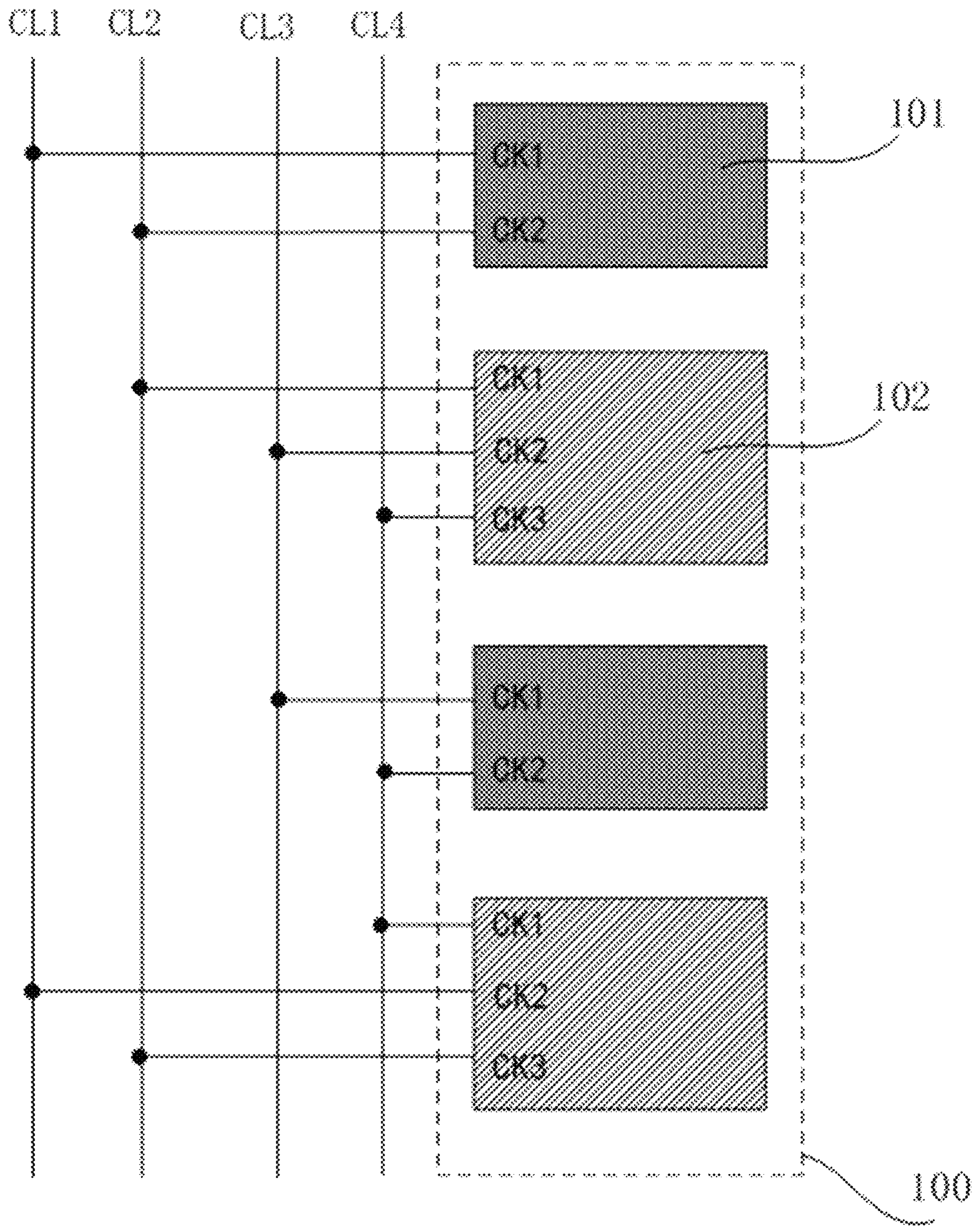
FIG. 27 is a connection schematic diagram of another scanning circuit according to an embodiment of the present disclosure.

FIG. 27 is a connection schematic diagram of a scanning circuit according to an embodiment of the present disclosure.

In an embodiment of the present disclosure, as shown in FIG. 10, FIG. 20 and FIG. 27, or in FIG. 12, FIG. 20 and FIG. 27, in the first shift register unit 101 of odd stages, the control terminal of the first input module 11 is electrically connected to the first clock signal line CL1, and the second input terminal of the auxiliary voltage-stabilizing module 18 is electrically connected to the second clock signal line CL2.

In the first shift register units 101 of even stages, the control terminal of the first input module 11 is electrically connected to the third clock signal line CL3, and the second input terminal of the auxiliary voltage-stabilizing module 18 is electrically connected to the fourth clock signal line CL4.

That is, in the first shift register unit 101 of odd stages, the clock signal transmitted by the first clock signal line CL1 serves as the first clock signal CK1 received by the first shift register unit 101, and the clock signal transmitted by the second clock signal line CL2 serves as the second clock signal CK2 received by the first shift register unit 101.

In the first shift register unit 101 of even stages, the clock signal transmitted by the third clock signal line CL3 serves as the first clock signal CK1 received by the first shift register unit 101, and the clock signal transmitted by the fourth clock signal line CL4 serves as the second clock signal CK2 received by the first shift register unit 101.

In an implementation, the clock signal lines connected to the first shift register unit 101 may share the clock signal lines connected to the second shift register unit 102 in the above solution, for example, sharing the clock signal lines with the second shift register unit 102 shown in FIG. 20 is beneficial to reducing the number of clock signal lines connected to the scanning circuit 100 composed of the first shift register unit 101 and the above second shift register unit 102, thereby reducing power consumption.

Figure 28:
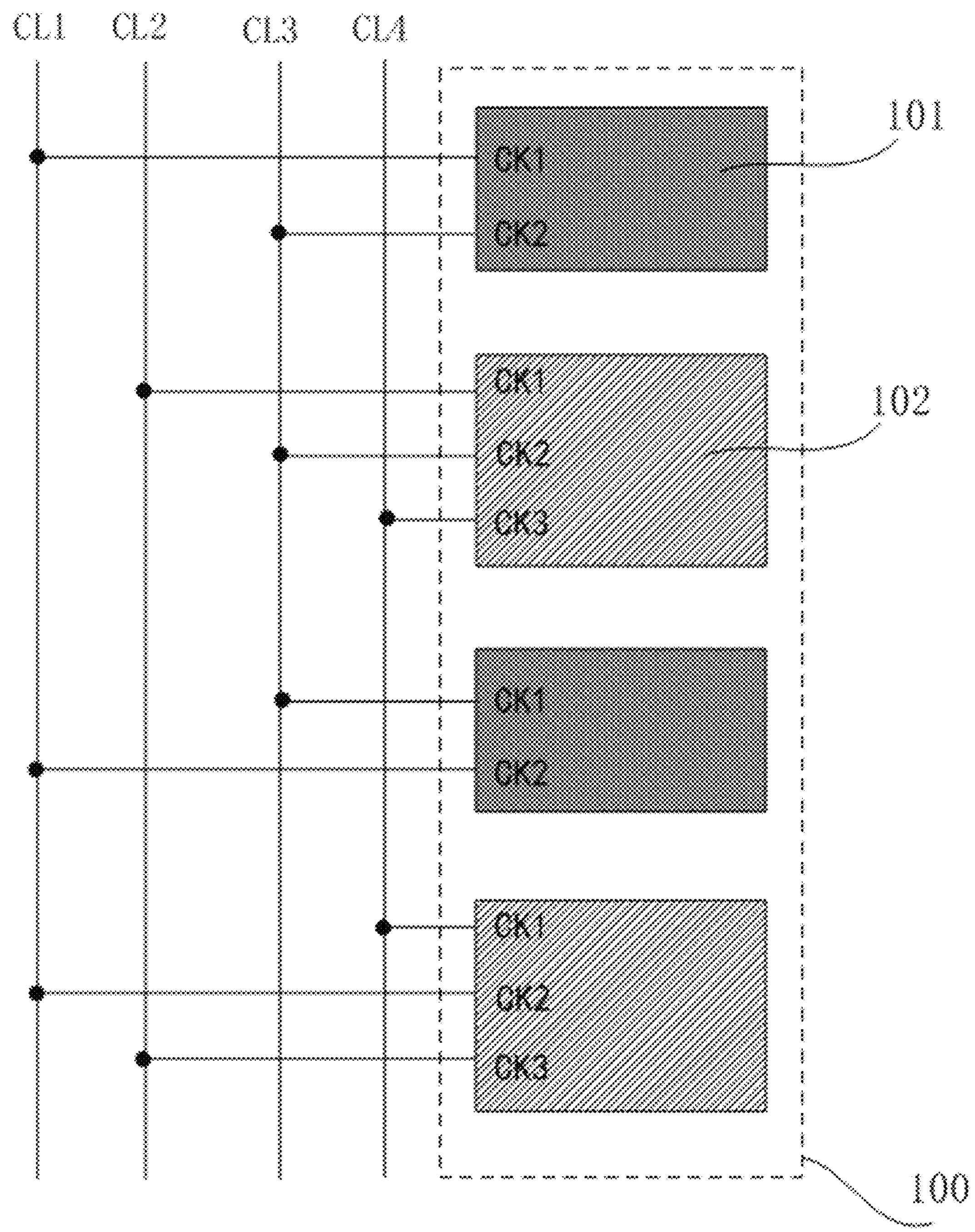
FIG. 28 is a connection schematic diagram of another scanning circuit according to an embodiment of the present disclosure.

FIG. 28 is a connection schematic diagram of a scanning circuit according to an embodiment of the present disclosure.

In an embodiment of the present disclosure, as shown in FIG. 10, FIG. 20 and FIG. 28, or FIG. 12, FIG. 20 and FIG. 28, in the first shift register unit 101 of odd stages, the control terminal of the first input module 11 is electrically connected to the first clock signal line CL1, and the second input terminal of the auxiliary voltage-stabilizing module 18 is electrically connected to the third clock signal line CL3 or the fourth clock signal line CL4.

In the first shift register units 101 of even stages, the control terminal of the first input module 11 is electrically connected to the third clock signal line CL3, and the second input terminal of the auxiliary voltage-stabilizing module 18 is electrically connected to the first clock signal line CL1 or the second clock signal line CL2.

That is, in the first shift register unit 101 of odd stages, the clock signal transmitted by the first clock signal line CL1 serves as the first clock signal CK1 received by the first shift register unit 101, and the clock signal transmitted by the third clock signal line CL3 and the fourth clock signal line CL4 serves as the second clock signal CK2 received by the first shift register unit 101.

In the first shift register unit 101 of even stages, the clock signal transmitted by the third clock signal line CL3 serves as the first clock signal CK1 received by the first shift register unit 101, and the clock signal transmitted by the first clock signal line CL1 and the second clock signal line CL2 serves as the second clock signal CK2 received by the first shift register unit 101.

It should be noted that FIG. 28 only schematically shows the case where the second input terminal of the auxiliary voltage-stabilizing module 18 is electrically connected to the third clock signal line CL3 in the first shift register unit 101 of odd stages, and the second input terminal of the auxiliary voltage-stabilizing module 18 is electrically connected to the first clock signal line CL1 in the first shift register unit 101 of even stages.

In an embodiment, when the first shift register unit 101 and the second shift register unit 102 (such as the second shift register unit shown in FIG. 20) share a clock signal line, the clock signal line connected to the second input terminal of the auxiliary voltage-stabilizing module 18 may be flexibly adjusted according to loads on different clock signal lines, so as to improve load uniformity of each clock signal line connected to the scanning circuit 100 and reduce signal output difference of the shift register unit caused by unbalanced loads of the clock signal lines.

As shown in FIG. 1 and FIG. 18, an embodiment of the present disclosure further provides a display panel 200 including the scanning circuit 100 provided in the above embodiments. Exemplarily, the display panel 200 may be any one of an organic light emitting diode (OLED) display panel, a micro-LED display panel, and a mini-LED display panel, which is not specifically limited in the present disclosure.

In the display panel 200, if the output terminal of the first voltage-stabilizing switch module 13 is electrically connected to the output terminal of the first input module 11, the first voltage-stabilizing switch module 13 can provide a voltage-stabilizing signal to the output terminal of the first input module 11, and compensate for the potential loss in the output process of the first input module 11, which is beneficial to improving the accuracy and stability of the potential of the output terminal of the first input module 11, further beneficial to improving the operational reliability of other modules receiving the potential of the output terminal of the first input module 11, and furthermore beneficial to improving the operational reliability of the first shift register unit 101.

If the output terminal of the first voltage-stabilizing switch module 13 is electrically connected to part of the control terminals of the first cascade module 12, the first voltage-stabilizing switch module 13 can provide a voltage-stabilizing signal to part of the control terminals of the first cascade module 12, which is beneficial to improving the stability of the potential of the control terminals of the first cascade module 12, further beneficial to improving the operational reliability of the first cascade module 12, and furthermore beneficial to improving the operational reliability of the first shift register unit 101.

Figure 29:
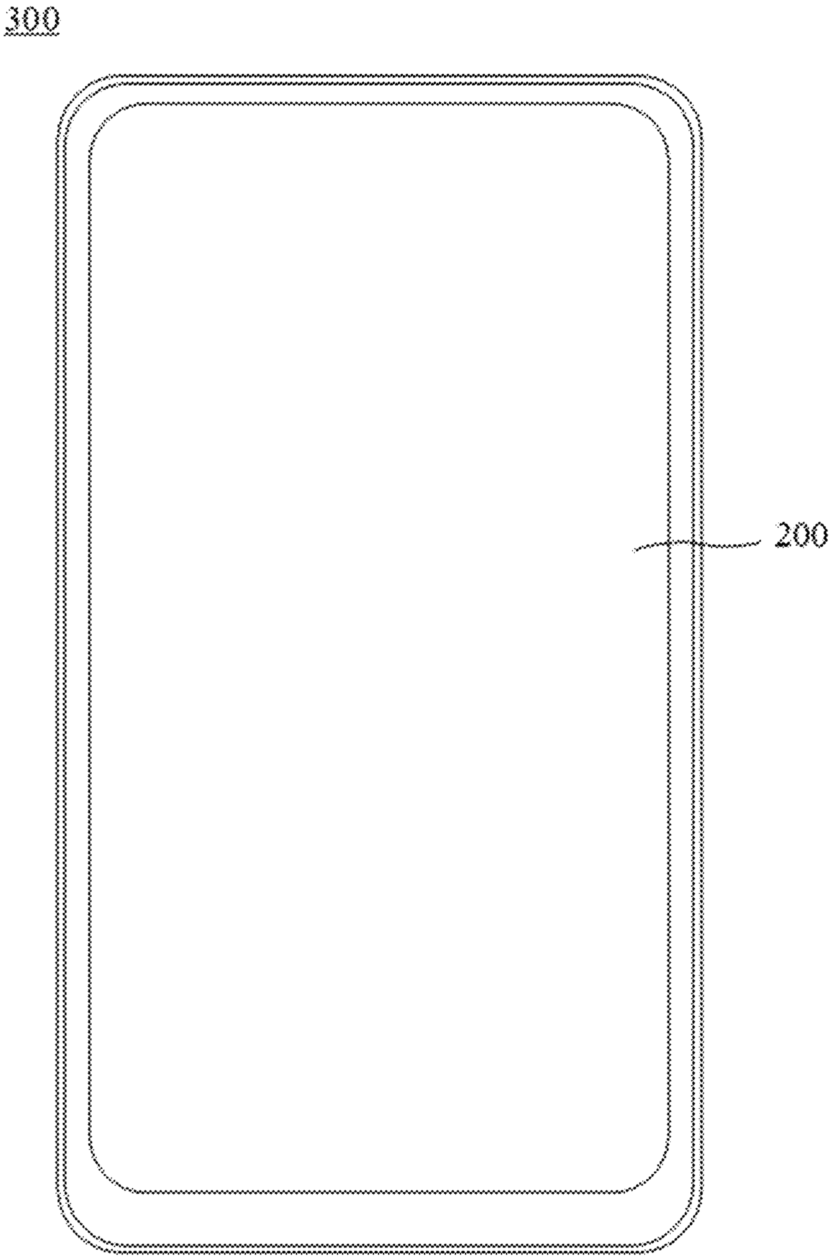
FIG. 29 is a schematic diagram of a display device according to an embodiment of the present disclosure.

FIG. 29 is a schematic diagram of a display device according to an embodiment of the present disclosure.

As shown in FIG. 29, an embodiment of the present disclosure provides a display device 300, including the display panel 200 provided by the above embodiment. Exemplarily, the display device 300 may be an electronic device such as a mobile phone, a computer, a television, an in-vehicle display, or a wearable display, which is not specifically limited in the present disclosure.

In the display device 300, if the output terminal of the first voltage-stabilizing switch module 13 is electrically connected to the output terminal of the first input module 11, the first voltage-stabilizing switch module 13 can provide a voltage-stabilizing signal to the output terminal of the first input module 11, and compensate for the potential loss in the output process of the first input module 11, which is beneficial to improving the accuracy and stability of the potential of the output terminal of the first input module 11, further beneficial to improving the operational reliability of other modules receiving the potential of the output terminal of the first input module 11, and furthermore beneficial to improving the operational reliability of the first shift register unit 101.

If the output terminal of the first voltage-stabilizing switch module 13 is electrically connected to part of the control terminals of the first cascade module 12, the first voltage-stabilizing switch module 13 can provide a voltage-stabilizing signal to part of the control terminals of the first cascade module 12, which is beneficial to improving the stability of the potential of the control terminals of the first cascade module 12, further beneficial to improving the operational reliability of the first cascade module 12, and furthermore beneficial to improving the operational reliability of the first shift register unit 101.

The above description merely illustrates some preferred embodiments of the present disclosure, but is not intended to limit the present disclosure. Any modification, equivalent substitution, improvement, and the like made within the spirit and the principle of the present disclosure shall fall with the protection scope of the present disclosure.

What is claimed is:

1. A scanning circuit, comprising at least a plurality of cascaded first shift register units, wherein at least one of the plurality of first shift register units comprises:

a first input module comprising an input terminal configured to receive a first trigger signal;

a first cascade module comprising an output terminal configured to output a first cascade signal; and a first voltage-stabilizing switch module, wherein an output terminal of the first voltage-stabilizing switch module is electrically connected to an output terminal of the first input module; and/or wherein the output terminal of the first voltage-stabilizing switch module is electrically connected to part of control terminals of the first cascade module; and wherein the first input module further comprises an output terminal electrically connected to a first node, and a control terminal configured to receive a first clock signal, the first cascade module further comprise a first input terminal configured to receive a first fixed potential signal, a second input terminal configured to receive a second fixed potential signal, and the control terminals electrically connected to a second node;

at least one first shift register unit further comprises a first control module, the first control module comprises a first input terminal configured to receive the first fixed potential signal, a second input terminal configured to receive the second fixed potential signal, a control terminal electrically connected to the first node, and an output terminal electrically connected to the second node; and the first voltage-stabilizing switch module comprises an input terminal configured to receive the second fixed potential signal, the output electrically connected to the first node, and a control terminal electrically connected to the second node.

2. The scanning circuit according to claim 1, wherein the first input module comprises a first transistor, the first transistor comprises a first electrode configured to receive the first trigger signal, a second electrode electrically connected to the first node, and a gate configured to receive the first clock signal;

wherein the first control module comprises a second transistor and a third transistor that have different channel types, the second transistor comprises a first electrode configured to receive the first fixed potential signal, a second electrode electrically connected to the second node, and a gate electrically connected to the first node; the third transistor comprises a first electrode configured to receive the second fixed potential signal, a second electrode electrically connected to the second node, and a gate electrically connected to the first node;

wherein the first cascade module comprises a fourth transistor and a fifth transistor that have different channel types, the fourth transistor comprises a first electrode configured to receive the first fixed potential signal, a second electrode electrically connected to the output terminal of the first cascade module, a gate of the fourth transistor electrically connected to the second node, and the fifth transistor comprises a first electrode configured to receive the second fixed potential signal, a second electrode electrically connected to the output terminal of the first cascade module, and a control terminal electrically connected to the second node;

wherein the first voltage-stabilizing switch module comprises a first voltage-stabilizing transistor, the first voltage-stabilizing transistor comprises a first electrode configured to receive the second fixed potential signal, a second electrode electrically connected to the first node, and a gate electrically connected to the second node; and wherein the second transistor and the fourth transistor have a same channel type, and the third transistor, the first voltage-stabilizing transistor, and the fifth transistor have a same channel type.

3. The scanning circuit according to claim 1, wherein the at least one first shift register unit comprises a first-type signal output module, and an output terminal of the first-type signal output module is configured to output a first-type scanning signal;

wherein the first-type signal output module comprises a first output module and a second output module, the first output module comprises an input terminal configured to receive the first fixed potential signal, an output terminal electrically connected to the output terminal of the first-type signal output module, and the second output module comprises an input terminal configured to receive the second fixed potential signal, and an output terminal electrically connected to the output terminal of the first-type signal output module;

wherein the at least one first shift register unit further comprises a gating module, and the gating module has a first input terminal configured to receive the first fixed potential signal, and a second input terminal electrically connected to a gating signal line; and wherein a control terminal of at least one of the first output module and the second output module is electrically connected to the output terminal of the gating module.

4. The scanning circuit according to claim 3, wherein the first output module comprises a sixth transistor, the sixth transistor comprises a first electrode configured to receive the first fixed potential signal, and a second electrode electrically connected to the output terminal of the first-type signal output module;

wherein the second output module comprises a seventh transistor, the seventh transistor comprises a first electrode configured to receive the second fixed potential signal, and a second electrode electrically connected to the output terminal of the first-type signal output module; and wherein the sixth transistor and the seventh transistor have different channel types.

5. The scanning circuit according to claim 4, wherein the gating module comprises a first sub-module and a second sub-module, wherein the first sub-module comprises an input terminal configured to receive the first fixed potential signal, a control terminal electrically connected to the second node, and an output terminal electrically connected to the control terminal of the first output module;

wherein the second sub-module comprises an input terminal electrically connected to the gating signal line, an output terminal electrically connected to the control terminal of the first output module, and a control terminal electrically connected to the output terminal of the first cascade module; and wherein the control terminal of the second output module is electrically connected to the output terminal of the first cascade module.

6. The scanning circuit according to claim 5, wherein the first sub-module comprises an eighth transistor, and the eighth transistor comprises a first electrode configured receive the first fixed potential signal, a second electrode electrically connected to a gate of the sixth transistor, and a gate electrically connected to the second node;

wherein the second sub-module comprises a ninth transistor, and the ninth transistor comprises a first electrode electrically connected to the gating signal line, a second electrode electrically connected to the gate of the sixth transistor, and a gate electrically connected to the output terminal of the first cascade module;

wherein a gate of the seventh transistor is electrically connected to the output terminal of the first cascade module; and wherein the eighth transistor and the ninth transistor have a same channel type different from the seventh transistor.

7. The scanning circuit according to claim 4, wherein the gating module comprises the first sub-module and the second sub-module;

wherein the first sub-module comprises an input terminal configured to receive the first fixed potential signal, a control terminal electrically connected to the second node, and an output terminal electrically connected to the control terminal of the first output module and the control terminal of the second output module; and wherein the second sub-module comprises an input terminal electrically connected to the gating signal line, a control terminal electrically connected to the second node, and an output terminal electrically connected to the control terminal of the first output module and the control terminal of the second output module.

8. The scanning circuit according to claim 1, wherein the at least one first shift register unit comprises a first capacitor, and the first capacitor has a first plate electrically connected to the first node, and a second plate configured to receive the second fixed potential signal.

9. The scanning circuit according to claim 1, wherein the first input module has a first output terminal electrically connected to a primary node, a second output terminal electrically connected to a secondary node, and a control terminal configured to receive a first clock signal, the primary node is coupled to a second primary node, and the first secondary node is coupled to a second secondary node;

wherein the first cascade module comprises a first cascade sub-module and a second cascade sub-module; the first cascade sub-module comprises an input terminal configured to receive the first fixed potential signal, an output terminal electrically connected to the output terminal of the first cascade module, and a control terminal electrically connected to a third node; and the second cascade sub-module comprises an input terminal configured to receive the second fixed potential signal, an output terminal electrically connected to the output terminal of the first cascade module, and a control terminal electrically connected to the second primary node;

wherein at least one first shift register unit further comprises a first control module, the first control module comprises a first control sub-module and a second control sub-module, the first control sub-module comprises an input terminal configured to receive the first fixed potential signal, an output terminal electrically connected to the third node, and a control terminal electrically connected to the first primary node; and the second control sub-module comprises an input terminal configured to receive the second fixed potential signal, an output terminal electrically connected to the third node, and a control terminal electrically connected to the second primary node; and wherein the first voltage-stabilizing switch module comprises an input terminal electrically connected to the second secondary node, an output terminal electrically connected to the second primary node, and a control terminal electrically connected to the second secondary node.

10. The scanning circuit according to claim 9, wherein the at least one first shift register unit further comprises an auxiliary voltage-stabilizing module, the auxiliary voltage-stabilizing module comprises a first input terminal configured to receive the first fixed potential signal, a second input terminal configured to receive a second clock signal, an output terminal electrically connected to the second secondary node, and the auxiliary voltage-stabilizing module is configured to adjust a potential of the second node.

11. The scanning circuit according to claim 10, wherein the auxiliary voltage-stabilizing module comprises a first capacitor, a seventh transistor and an eighth transistor, and the seventh transistor and the eighth transistor have the a same channel type; and wherein the first capacitor comprises a first plate electrically connected to the second secondary node, and a second plate electrically connected to a fourth node, the seventh transistor comprises a first electrode configured to receive the second clock signal, a second electrode electrically connected to the fourth node, and a gate electrically connected to the second secondary node, and the eighth transistor comprises a first electrode configured to receive the first fixed potential signal, a second electrode electrically connected to the fourth node, and a gate electrically connected to the third node.

12. The scanning circuit according to claim 11, wherein both the seventh transistor and the eighth transistor are P-type transistors.

13. The scanning circuit according to claim 1, further comprising a plurality of cascaded second shift register units, wherein at least one of the plurality of second shift register units comprises a second input module and a second-type signal output module, the second input module is configured to receive a second trigger signal, an output terminal of the second-type signal module is configured to output a second-type scanning signal, an output terminal of the second input module is electrically connected to a seventh node, and the seventh node is coupled to part of control terminals of the second-type scanning signal module; and wherein at least one second shift register unit further comprises a second voltage-stabilizing switch module, and an output terminal of the second voltage-stabilizing switch module is electrically connected to the seventh node.

14. The scanning circuit according to claim 13, wherein a control terminal of the second input module is configured to receive the first clock signal, and the second-type signal output module comprises a first scanning signal output module and a second scanning signal output module;

wherein the first scanning signal output module comprises a third output module and a fourth output module, the third output module comprises an input terminal configured to receive a first fixed potential signal, an output terminal electrically connected to the output terminal of the first scanning signal output module, and a control terminal electrically connected to an eighth node; and the fourth output module comprises an input terminal configured receive the second clock signal, an output terminal electrically connected to the output terminal of the first scanning signal output module, and a control terminal coupled to the seventh node;

wherein the second scanning signal output module comprises a fifth output module and a sixth output module, the fifth output module comprises an input terminal configured to receive the first fixed potential signal, an output terminal electrically connected to an output terminal of the second scanning signal output module, and a control terminal electrically connected to the eighth node; the sixth output module comprises an input terminal configured to receive a third clock signal, an output terminal electrically connected to an output terminal of the second scanning signal output module, and a control terminal coupled to the seventh node; and wherein the at least one second shift register unit further comprises a second control module, and an output terminal of the second control module is electrically connected to the eighth node and the second voltage-stabilizing switch module.

15. The scanning circuit according to claim 10, wherein in first shift register units of odd stages, a control terminal of the first input module is electrically connected to a first clock signal line, and the second input terminal of the auxiliary voltage-stabilizing module is electrically connected to a second clock signal line; and in first shift register units of even stages, the control terminal of the first input module is electrically connected to a third clock signal line, and the second input terminal of the auxiliary voltage-stabilizing module is electrically connected to a fourth clock signal line.

16. The scanning circuit according to claim 10, wherein, in first shift register units of odd stages, a control terminal of the first input module is electrically connected to a first clock signal line, and the second input terminal of the auxiliary voltage-stabilizing module is electrically connected to a third clock signal line or a fourth clock signal line; and in first shift register units of even stages, the control terminal of the first input module is electrically connected to the third clock signal line, and the second input terminal of the auxiliary voltage-stabilizing module is electrically connected to the first clock signal line or a second clock signal line.

17. A display panel, comprising a scanning circuit, wherein the scanning circuit comprises at least a plurality of cascaded first shift register units, and at least one of the plurality of first shift register units comprises:

a first input module comprising an input terminal configured to receive a first trigger signal;

a first cascade module comprising an output terminal configured to output a first cascade signal; and a first voltage-stabilizing switch module;

wherein an output terminal of the first voltage-stabilizing switch module is electrically connected to an output terminal of the first input module; and/or wherein the output terminal of the first voltage-stabilizing switch module is electrically connected to part of control terminals of the first cascade module; and wherein the first input module further comprises an output terminal electrically connected to a first node, and a control terminal configured to receive a first clock signal, the first cascade module further comprise a first input terminal configured to receive a first fixed potential signal, a second input terminal configured to receive a second fixed potential signal, and the control terminals electrically connected to a second node:

at least one first shift register unit further comprises a first control module, the first control module comprises a first input terminal configured to receive the first fixed potential signal, a second input terminal configured to receive the second fixed potential signal, a control terminal electrically connected to the first node, and an output terminal electrically connected to the second node; and the first voltage-stabilizing switch module comprises an input terminal configured to receive the second fixed potential signal, the output electrically connected to the first node, and a control terminal electrically connected to the second node.

18. A display device, comprising a display panel, wherein the display panel comprises a scanning circuit, the scanning circuit comprises at least a plurality of cascaded first shift register units, and at least one of the plurality of first shift register units comprises:

a first input module comprising an input terminal configured to receive a first trigger signal;

a first cascade module comprising an output terminal configured to output a first cascade signal; and a first voltage-stabilizing switch module;

wherein an output terminal of the first voltage-stabilizing switch module is electrically connected to an output terminal of the first input module; and/or wherein the output terminal of the first voltage-stabilizing switch module is electrically connected to part of control terminals of the first cascade module; and wherein the first input module further comprises an output terminal electrically connected to a first node, and a control terminal configured to receive a first clock signal, the first cascade module further comprise a first input terminal configured to receive a first fixed potential signal, a second input terminal configured to receive a second fixed potential signal, and the control terminals electrically connected to a second node;

at least one first shift register unit further comprises a first control module, the first control module comprises a first input terminal configured to receive the first fixed potential signal, a second input terminal configured to receive the second fixed potential signal, a control terminal electrically connected to the first node, and an output terminal electrically connected to the second node; and the first voltage-stabilizing switch module comprises an input terminal configured to receive the second fixed potential signal, the output electrically connected to the first node, and a control terminal electrically connected to the second node.

19. The scanning circuit according to claim 9, further comprising a plurality of cascaded second shift register units, wherein at least one of the plurality of second shift register units comprises a second input module and a second-type signal output module, the second input module is configured to receive a second trigger signal, an output terminal of the second-type signal module is configured to output a second-type scanning signal, an output terminal of the second input module is electrically connected to a seventh node, and the seventh node is coupled to part of control terminals of the second-type scanning signal module; and wherein at least one second shift register unit further comprises a second voltage-stabilizing switch module, and an output terminal of the second voltage-stabilizing switch module is electrically connected to the seventh node.

* * * * *